(12) United States Patent
Ji

(10) Patent No.: US 12,266,707 B2
(45) Date of Patent: Apr. 1, 2025

(54) SEMICONDUCTOR DEVICE WITH NANO SHEET TRANSISTOR AND METHOD FOR FABRICATING THE SAME

(71) Applicant: SK hynix Inc., Gyeonggi-do (KR)

(72) Inventor: Yun Hyuck Ji, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 499 days.

(21) Appl. No.: 17/568,476

(22) Filed: Jan. 4, 2022

(65) Prior Publication Data
US 2023/0009388 A1 Jan. 12, 2023

(30) Foreign Application Priority Data

Jul. 7, 2021 (KR) ............... 10-2021-0089089

(51) Int. Cl.
| | |
|---|---|
| *H01L 29/423* | (2006.01) |
| *H01L 21/8238* | (2006.01) |
| *H01L 27/092* | (2006.01) |
| *H01L 29/06* | (2006.01) |
| *H01L 29/49* | (2006.01) |
| *H01L 29/786* | (2006.01) |

(52) U.S. Cl.
CPC .......... *H01L 29/42392* (2013.01); *H01L 21/823807* (2013.01); *H01L 21/823814* (2013.01); *H01L 21/823857* (2013.01); *H01L 27/092* (2013.01); *H01L 29/0665* (2013.01); *H01L 29/4966* (2013.01); *H01L 29/78696* (2013.01)

(58) Field of Classification Search
CPC ....... H01L 29/42392; H01L 21/823807; H01L 21/823814; H01L 21/823857; H01L 27/092; H01L 29/0665; H01L 29/4966; H01L 29/78696; H01L 29/0673; H01L 21/823821; H01L 21/823828; H01L 29/66787; H01L 29/7831–7832; H01L 21/823437–823456; H01L 29/66484; B82Y 10/00

See application file for complete search history.

(56) References Cited

U.S. PATENT DOCUMENTS

| | | |
|---|---|---|
| 9,224,810 B2 | 12/2015 | Kim et al. |
| 9,871,140 B1 | 1/2018 | Balakrishnan et al. |
| 2019/0189739 A1* | 6/2019 | Li ................... B82Y 10/00 |
| 2020/0035786 A1 | 1/2020 | Kie et al. |
| 2021/0082766 A1* | 3/2021 | Miura ............ H01L 21/82345 |
| 2021/0384313 A1* | 12/2021 | Cheng ............ H01L 21/28185 |

* cited by examiner

*Primary Examiner* — Shahed Ahmed
(74) *Attorney, Agent, or Firm* — IP & T GROUP LLP

(57) ABSTRACT

A semiconductor device comprises: a substrate including first and second buried source/drain layers; a first nano sheet stack including first nano sheets stacked in a direction vertical to the substrate; a second nano sheet stack including second nano sheets stacked in a direction vertical to the substrate; an isolation wall disposed between the first nano sheet stack and the second nano sheet stack; first gate covering portions of the first nano sheet stack and extending in a direction vertical to the substrate; second gate covering portions of the second nano sheet stack and extending in a direction vertical to the substrate; first common source/drain layers connected to end portions of the first nano sheets and to the first buried source/drain layers; and second common source/drain layers connected to end portions of the second nano sheets and to the second buried source/drain layers.

15 Claims, 26 Drawing Sheets

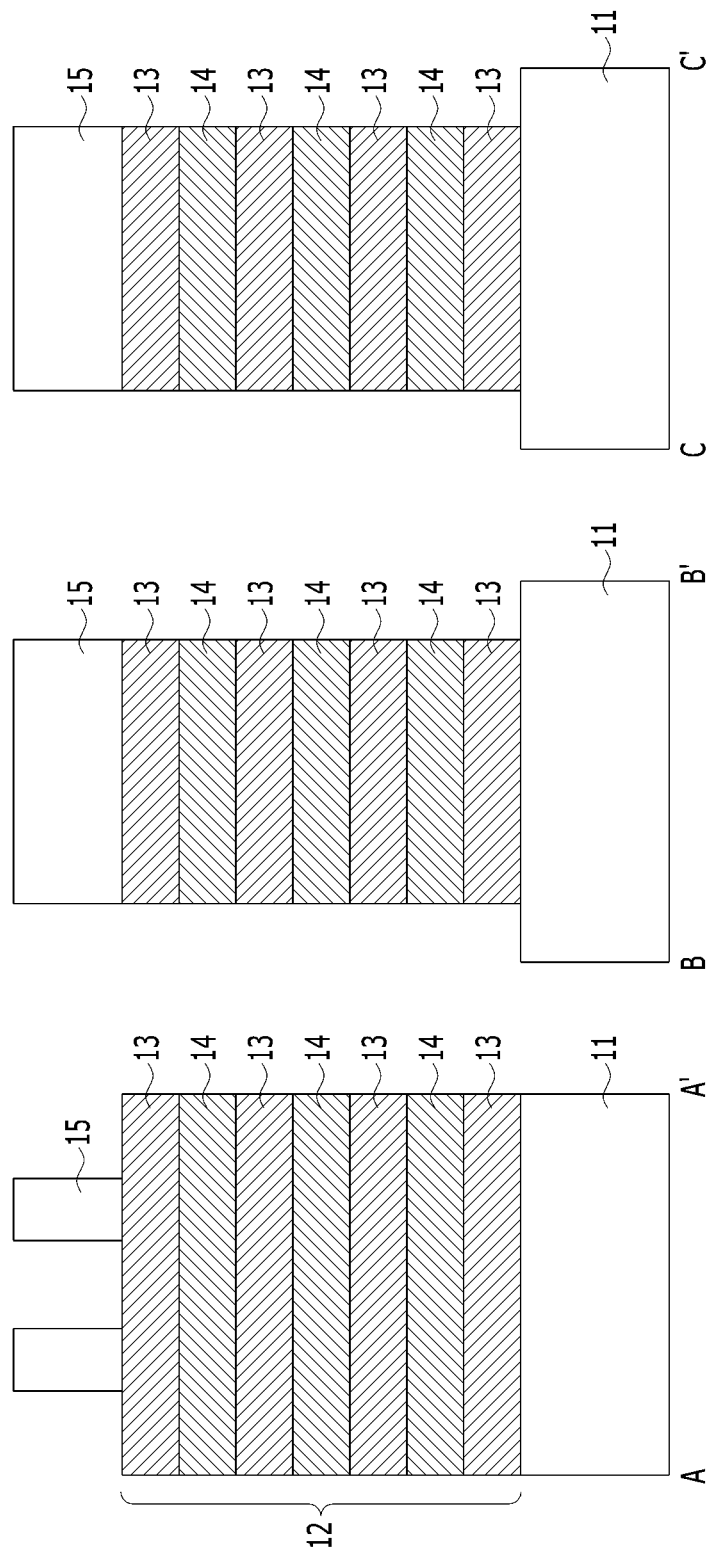

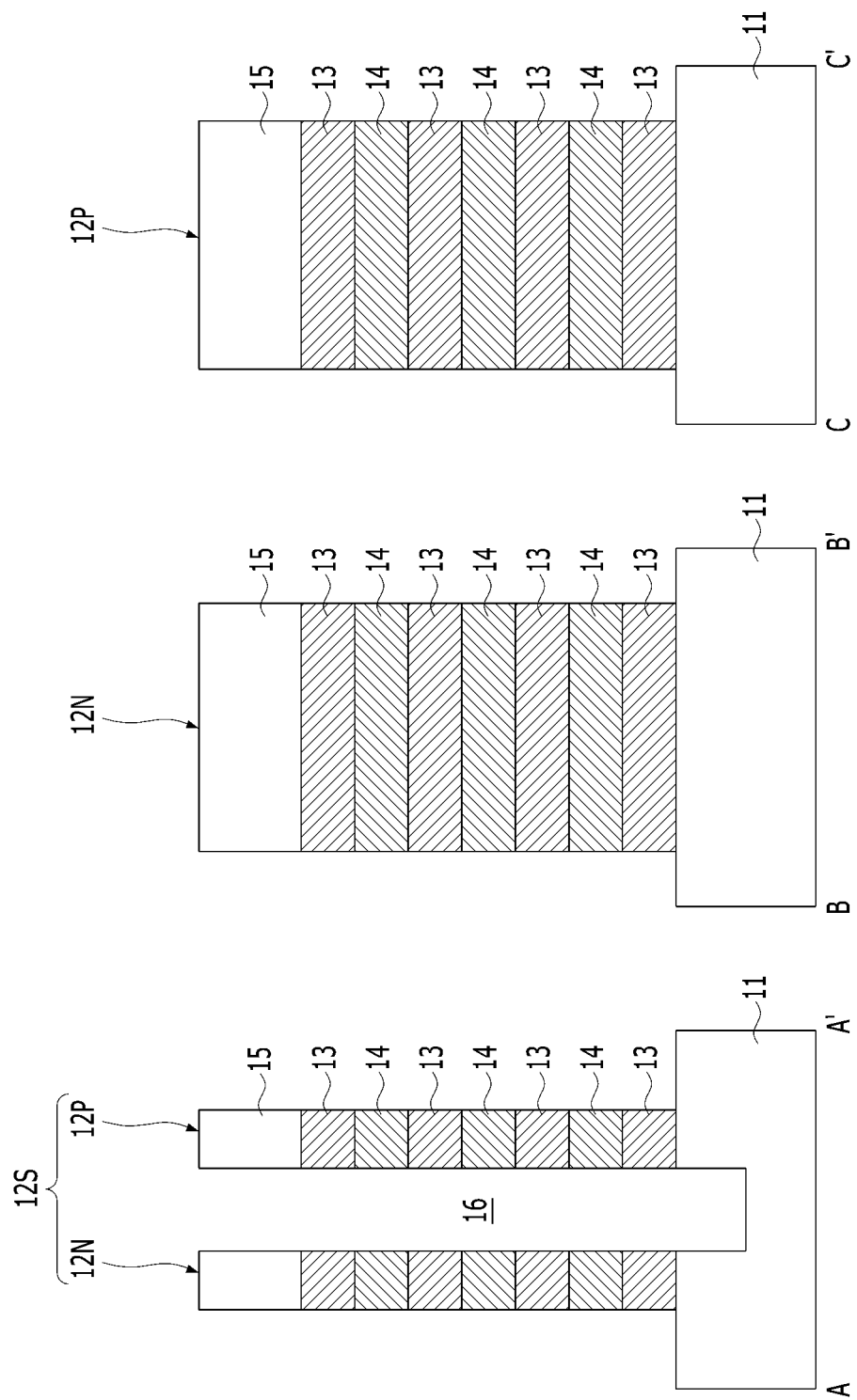

SEMICONDUCTOR DEVICE WITH NANO SHEET TRANSISTOR AND METHOD FOR FABRICATING THE SAME

CROSS-REFERENCE TO RELATED APPLICATIONS

The present application claims priority to Korean Patent Application No. 10-2021-0089089, filed on Jul. 7, 2021, which is incorporated herein by reference in its entirety.

BACKGROUND

1. Field

Present invention relates to a semiconductor device and, more particularly, to a semiconductor device including a nano sheet transistor and a method for fabricating the same.

2. Description of the Related Art

As semiconductor devices are highly integrated, research on semiconductor devices including multi-gates such as tri-gates is being actively conducted in order to further improve transistor performance.

SUMMARY

Various embodiments of the present invention provide a semiconductor device capable of improving gate controllability and a method for fabricating the same.

A semiconductor device according to an embodiment of the present invention comprises: a substrate including first buried source/drain layers and second buried source/drain layers; a first nano sheet stack including a plurality of first nano sheets stacked in a direction vertical to the substrate; a second nano sheet stack including a plurality of second nano sheets stacked in a direction vertical to the substrate; an isolation wall disposed between the first nano sheet stack and the second nano sheet stack; a first gate covering portions of the first nano sheet stack and extending in a direction vertical to the substrate; a second gate covering portions of the second nano sheet stack and extending in a direction vertical to the substrate; first common source/drain layers connected to end portions of the first nano sheets and to the first buried source/drain layers; and second common source/drain layers connected to end portions of the second nano sheets and to the second buried source/drain layers.

A semiconductor device according to an embodiment of the present invention comprises: a substrate; a first nano sheet transistor array including a plurality of silicon nano sheets which are stacked in a direction vertical to the substrate; a second nano sheet transistor array including a plurality of silicon germanium nano sheets which are stacked in a direction vertical to the substrate; and an isolation wall disposed between the first nano sheet transistor array and the second nano sheet transistor array, wherein the silicon nano sheets and the silicon germanium nano sheets are disposed at different horizontal levels.

A method for fabricating a semiconductor device according to an embodiment of the present invention comprises: forming an alternating stack in which first semiconductor materials and second semiconductor materials are alternately disposed on a substrate; forming a first sheet stack and a second sheet stack by etching the alternating stack; forming an isolation wall between the first and second sheet stacks; forming buried source/drain layers in the substrate to be aligned with the first and second sheet stacks; removing the second semiconductor materials from the first sheet stack to form a first nano sheet stack of the first semiconductor materials; removing the first semiconductor materials from the second sheet stack to form a second nano sheet stack of the second semiconductor materials; forming a first gate and a second gate on the first nano sheet stack and the second nano sheet stack, respectively; and forming first common source/drain layers and second common source/drain layers connected to the first nano sheet stack and the second nano sheet stack, respectively.

The present invention vertically stacks nano sheet channels and forms a gate around at least three surfaces of the nano sheet channels. Thus, the short channel effect can be suppressed with improved gate controllability.

The present invention stacks three-dimensional nano sheet channels vertically. Thus, a transistor according to the present invention may have a driving current greater than a two-dimensional transistor.

BRIEF DESCRIPTION OF THE DRAWINGS

FIGS. 4 to 18 are diagrams illustrating a method for fabricating a semiconductor device according to an embodiment of the present invention.

DETAILED DESCRIPTION

Figure 1A:
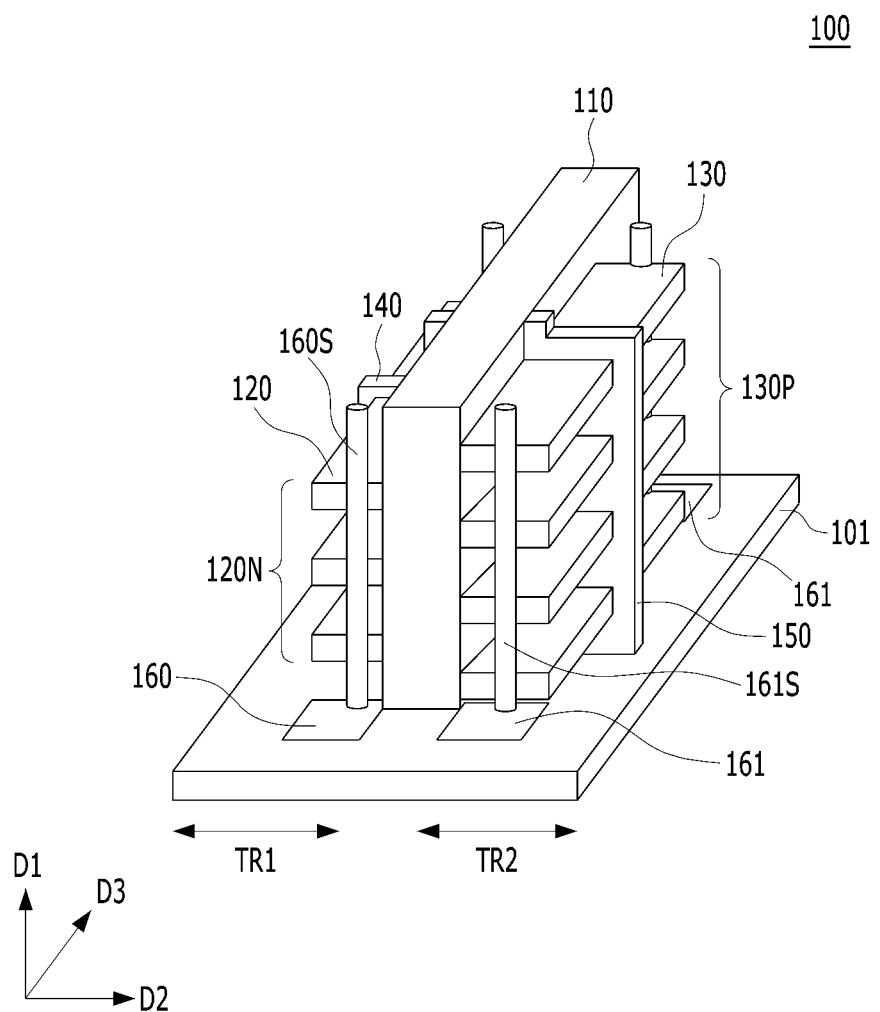
FIG. 1A is a schematic perspective view illustrating a semiconductor device according to an embodiment of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings but include any changes in the structures that may be produced according to the fabricating process. Also, any regions and shapes of regions illustrated in the drawings having schematic views, are intended to illustrate specific examples of structures of regions of the various elements and are not intended to limit the scope of the invention.

Figure 1B:
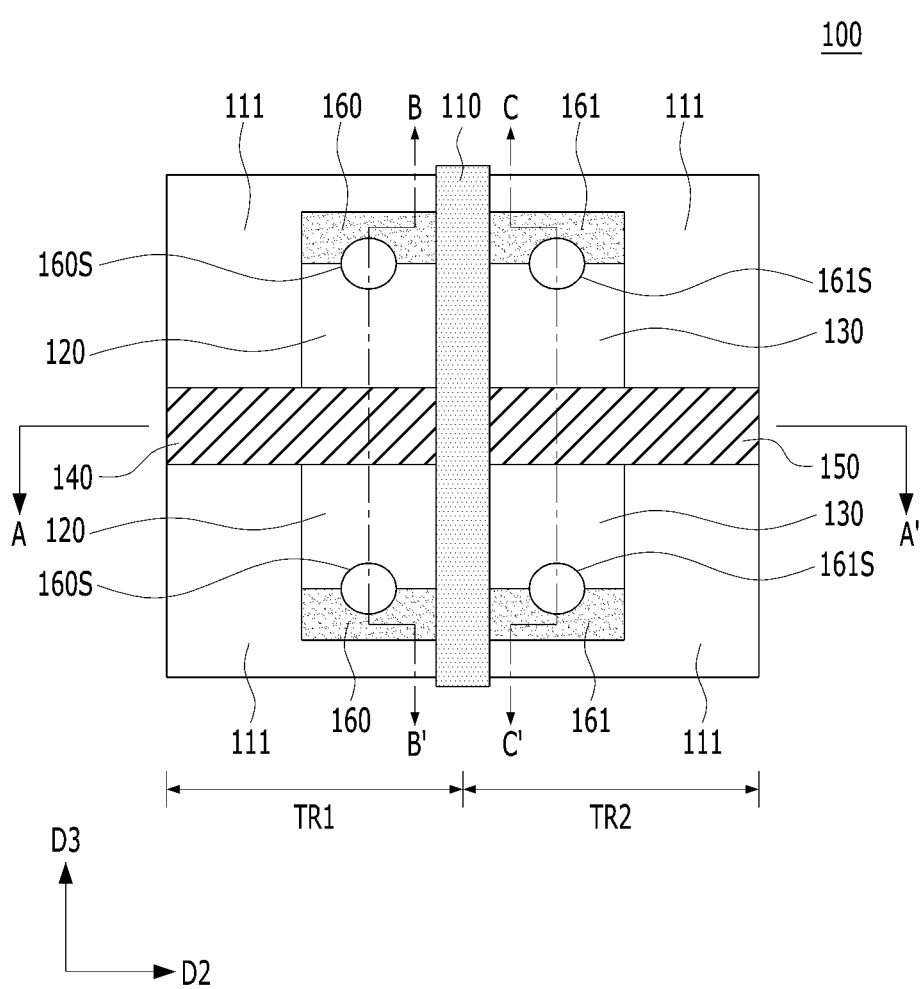
FIG. 1B is a schematic plan view illustrating a semiconductor device according to an embodiment of the present invention.
Figure 2A:
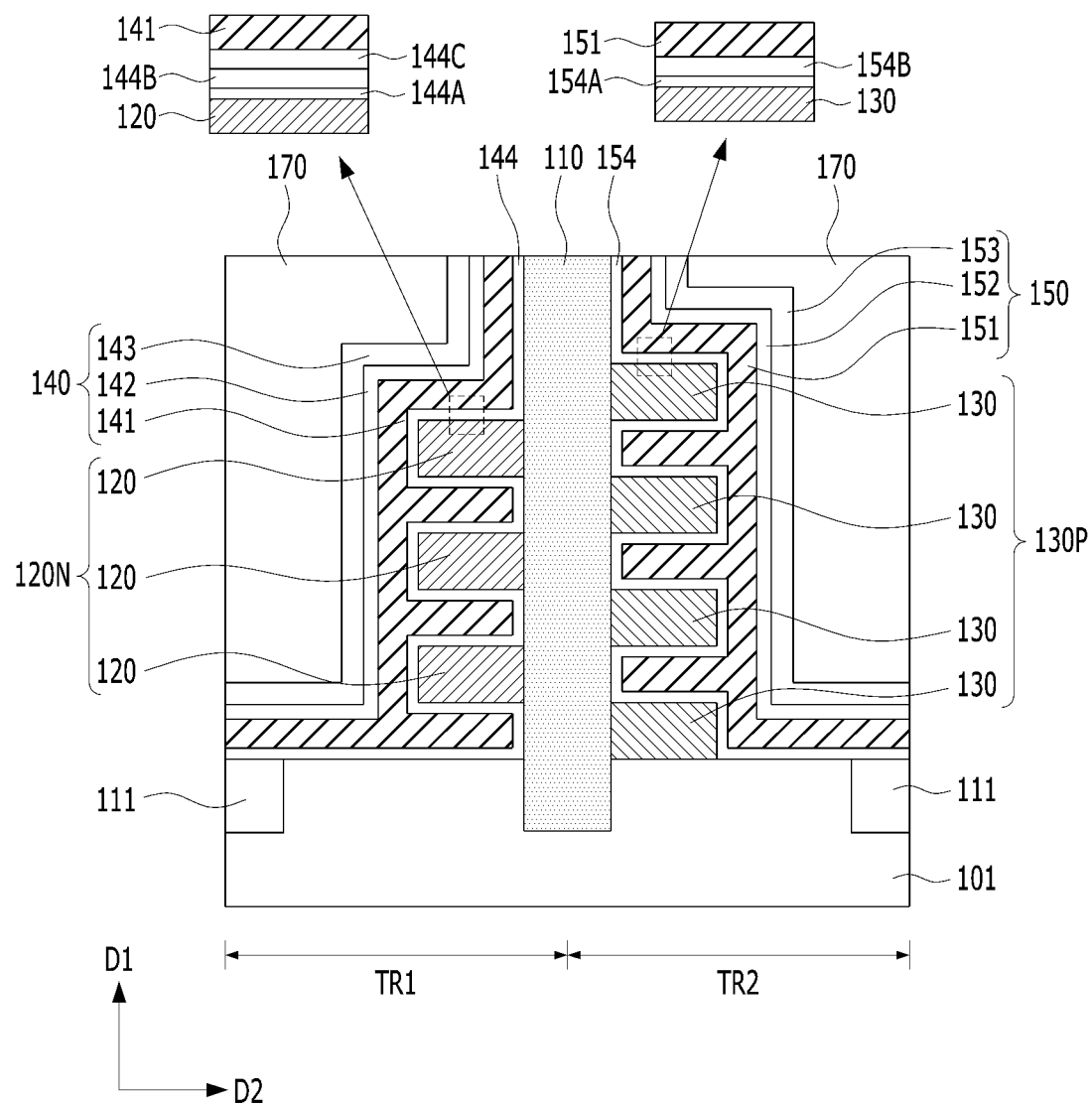
FIG. 2A is a cross-sectional view taken along line A-A' of FIG. 1B.
Figure 2B:
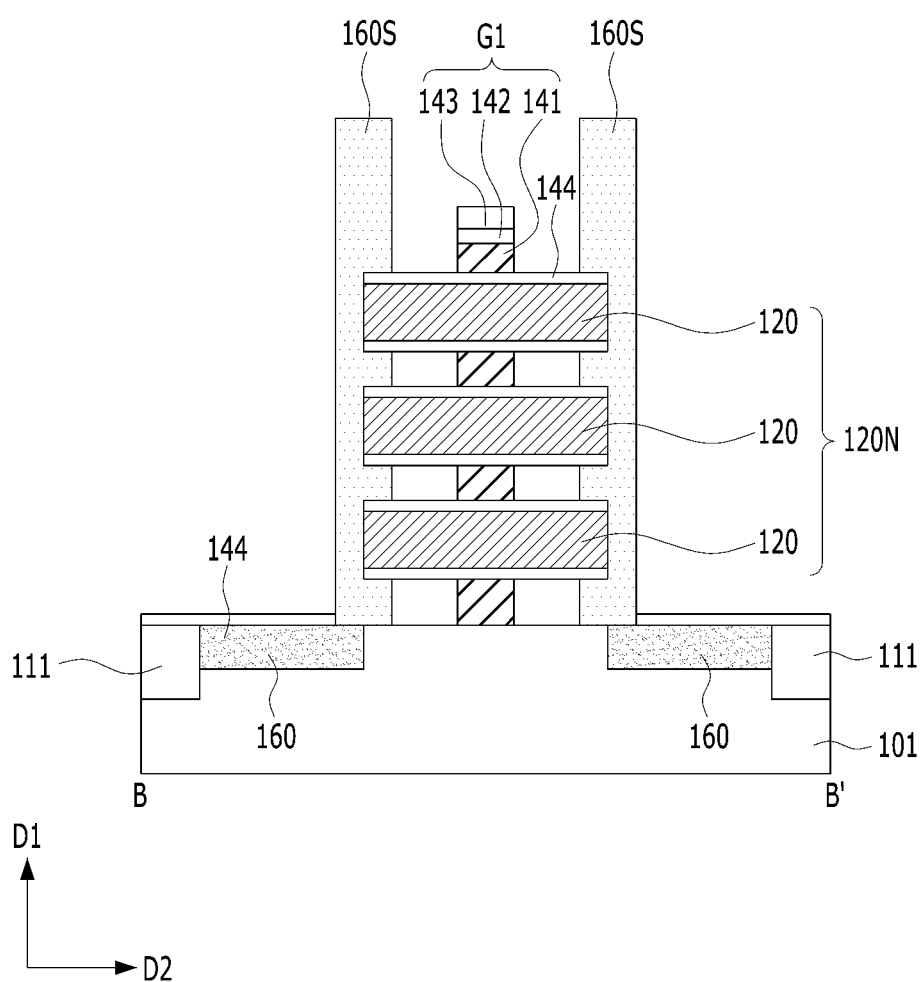
FIG. 2B is a cross-sectional view taken along line B-B' of FIG. 1B.
Figure 2C:
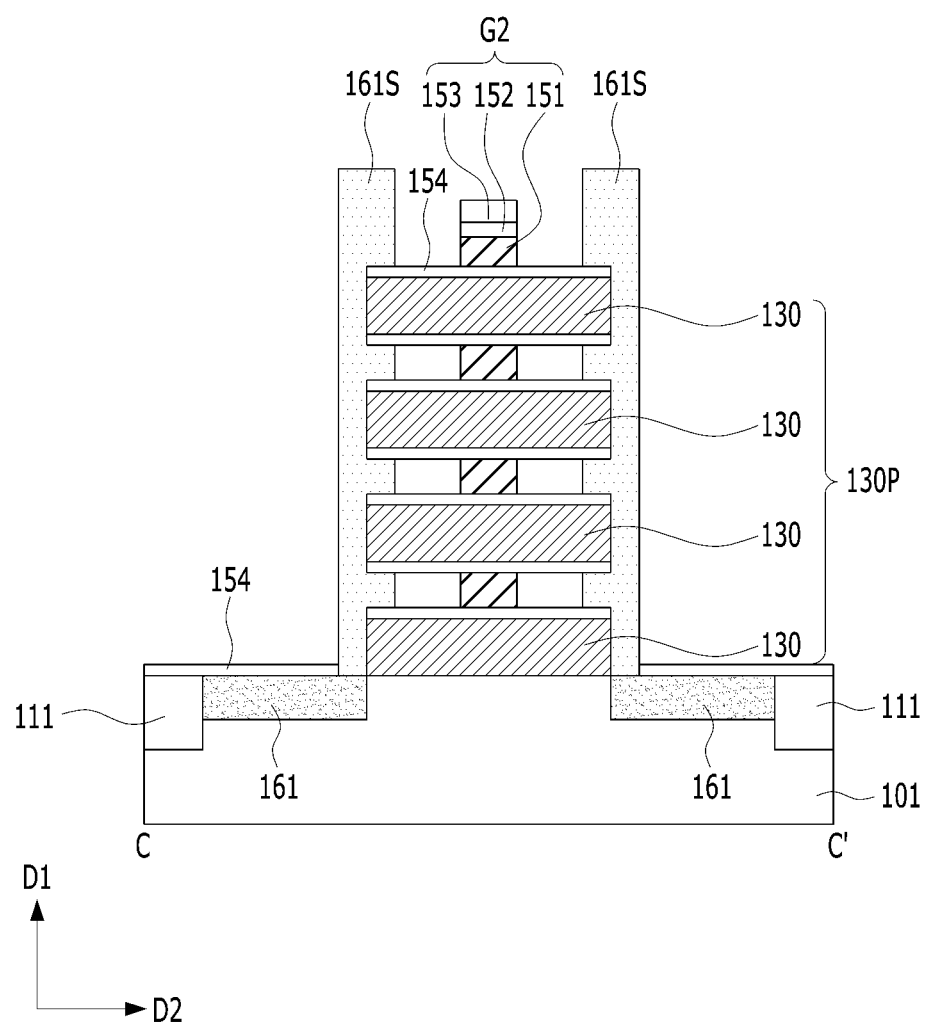
FIG. 2C is a cross-sectional view taken along line C-C' of FIG. 1B.
Figure 2D:
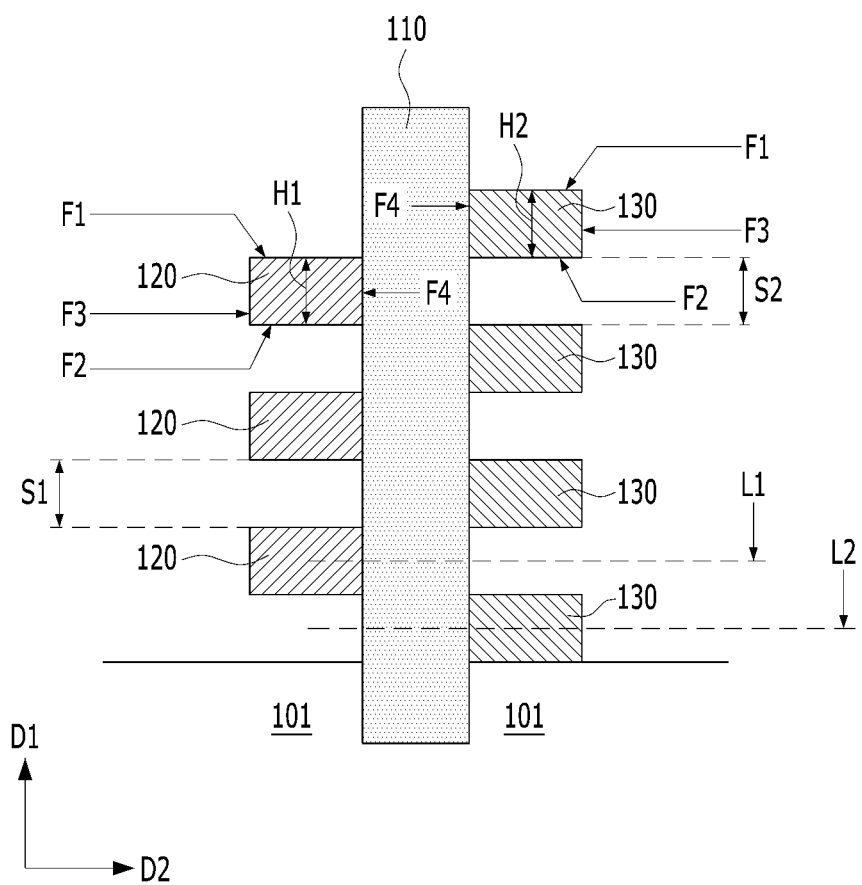
FIG. 2D is a detailed view of a dual-channel nano sheet.

FIG. 1A is a schematic perspective view illustrating a semiconductor device according to an embodiment of the present invention. FIG. 1B is a schematic plan view illustrating a semiconductor device according to an embodiment of the present invention. FIG. 2A is a cross-sectional view taken along line A-A' of FIG. 1B. FIG. 2B is a cross-sectional view taken along line B-B' of FIG. 1B. FIG. 2C is a cross-sectional view taken along line C-C' of FIG. 1B. FIG. 2D is a detailed view of a dual-channel nano sheet.

Referring to FIGS. 1A to 2D, the semiconductor device 100 may include a substrate 101, a first transistor array TR1 and a second transistor array TR2. The first transistor array TR1 and the second transistor array TR2 may be formed on the substrate 101.

The first transistor array TR1 and the second transistor array TR2 may be spaced apart from each other by an isolation wall 110. The isolation wall 110 may extend along a first direction D1 which is vertical to top of the substrate 101. The first transistor array TR1 and the second transistor array TR2 may be disposed along a second direction D2 with the isolation wall 110 interposed therebetween. The isolation wall 110 may extend long in a third direction D3 to space apart the first transistor array TR1 from the second transistor array TR2. The isolation wall 110 is a dielectric isolation wall. For example, the isolation wall 110 may include silicon oxide, silicon nitride, or a combination thereof.

The first transistor array TR1 may include a plurality of first transistors. The first transistor array TR1 may include a first nano sheet stack 120N and a first gate 140. The first nano sheet stack 120N may include a plurality of first nano sheets 120.

The first nano sheets 120 may be vertically stacked on the substrate 101 in the first direction D1. That is, the first nano sheet stack 120N is first vertically stacked nano sheets including a plurality of first nano sheets 120 stacked in the first direction D1 which is vertical to the substrate 101. The first gate 140 may extend vertically along the first direction D1 while covering a portion (e.g., a channel) of the first nano sheets 120. The first gate 140 may be referred to as a first vertical gate. The first gate 140 may be disposed around (or may cover) at least three surfaces of the first nano sheets 120. Referring to FIGS. 2A and 2D, the individual first nano sheet 120 may include four surfaces, for example, an upper surface F1, a lower surface F2 opposite to the upper surface F1, a first side F3, and a second side F4 opposite to the first side F3. The first gate 140 may cover the upper surface F1, the lower surface F2, and the first side F3 of the first nano sheets 120. The second side F4 of the first nano sheets 120 may directly contact the isolation wall 110 and may not be covered by the first gate 140. The first gate 140 may be referred to as a tri-gate or an around-gate. The tri-gate and the around-gate may have different structures from the gate all around. For example, the gate all around has a structure surrounding all surfaces of a nano sheet, whereas the tri-gate and the around-gate have a structure covering three surfaces of a nano sheet. The first transistor array TR1 may be an array of tri-gate nano sheet transistors.

The first nano sheets 120 may be a monocrystalline material. The first nano sheets 120 may be a semiconductor material formed by epitaxial growth. The first nano sheets 120 may include a silicon layer or a silicon germanium layer. The first nano sheets 120 may include an oxide semiconductor material such as IGZO. Each of the first nano sheets 120 may have a thickness of 50 to 300 Å.

The first gate 140 may include a conductive stack including a plurality of conductive materials. For example, the first gate 140 may include a stack of a first around-gate layer 141, a first liner gate layer 142, and a first low resistivity gate layer 143. The first around-gate layer 141 may cover the upper surfaces F1, the lower surfaces F2, and the first sides F3 of the first nano sheets 120. The first around-gate layer 141, the first liner gate layer 142, and the first low resistivity gate layer 143 may include a semiconductor material, a metal material, a metal nitride, a metal silicide, or a combination thereof. The first around-gate layer 141 may include TiN, TiSiN, TiAlN, TiCN, TaN, TaSiN, TaAlN, or TaCN. In an embodiment, the first around-gate layer 141 may include titanium nitride, the first liner gate layer 142 may include polysilicon, and the first low resistivity gate layer 143 may include tungsten. In another embodiment, the first around-gate layer 141 may include a low work function material whose work function is less than about 4.5 eV or an N-type work function material.

A first gate dielectric layer 144 may be formed between the first gate 140 and the first nano sheets 120. The first gate dielectric layer 144 may cover the surface of the substrate 101. The first gate dielectric layer 144 may include a multilayer structure disposed between the first nano sheets 120 and the first gate layer 141. For example, the first gate dielectric layer 144 may be a stack of a first interface layer 144A, a first high-k layer 144B, and a dipole inducing layer 144C. The first interface layer 144A may directly contact the first nano sheets 120, and the dipole inducing layer 144C may directly contact the first gate layer 141. A dipole may be generated between the first interface layer 144A and the first high-k layer 144B by the dipole inducing layer 144C. The first gate dielectric layer 144 may be formed to include the dipole because the first gate dielectric layer 144 includes the dipole inducing layer 144C as described above. The first interfacial layer 144A may include silicon oxide or silicon oxynitride, and the first high-k layer 144B may include a hafnium-based material. The first high-k layer 144B may include $HfO_2$, HfON, HfSiO, HfSiON, HfZrO, or HfZrON. The dipole inducing layer 144C may include lanthanum oxide or magnesium oxide.

The first transistor array TR1 may further include first buried source/drain layer 160 formed in the substrate 101. The first buried source/drain layers 160 may be formed in the substrate 101 on both sides of the first nano sheet stack 120N in the third direction D3. The first transistor array TR1 may further include first common source/drain layers 160S commonly connected to both end portions of the first nano sheets 120. The first common source/drain layers 160S may extend vertically along the first direction D1 to be connected to the first buried source/drain layers 160. In another embodiment, the first common source/drain layers 160S may extend vertically through the end portions of the first nano sheets 120. In another embodiment, the first common source/drain layers 160S may include an epitaxial silicon layer epitaxially grown from the end portions of the first nano sheets 120. The first common source/drain layers 160S may be respectively connected to both end portions of the first nano sheets 120. The first buried source/drain layers 160 and the first common source/drain layers 160S may include a semiconductor material, a metal, a metal nitride, a metal silicide, or a combination thereof. In an embodiment, the first buried source/drain layers 160 may include cobalt silicide, nickel silicide, titanium silicide, tungsten silicide, or molybdenum silicide. In an embodiment, the first common source/drain layers 160S may include polysilicon.

The second transistor array TR2 may include a plurality of second transistors. The second transistor array TR2 may include a second nano sheet stack 130P and a second gate 150, and the second nano sheet stack 130P may include a plurality of second nano sheets 130.

The second nano sheets 130 may be vertically stacked along the first direction D1 on the substrate 101. That is, the second nano sheet stack 130P may be also referred to as second vertically stacked nano sheets including a plurality of second nano sheets 130 stacked in the first direction D1 which is vertical to the substrate 101. The second gate 150 may extend vertically along the first direction D1 while covering a portion (e.g., a channel) of the second nano sheets 130. The second gate 150 may be referred to as a second vertical gate. The second gate 150 may cover at least three surfaces of the second nano sheets 130. Referring back to FIGS. 2A and 2D, each second nano sheet 130 may have four surfaces, for example, an upper surface F1, a lower surface F2 opposite to the upper surface F1, a first side F3 and a second side F4 opposite to the first side F3. The second gate 150 may cover the upper surface F1, the lower surface F2, and the first side F3 of the second nano sheets 130. The second side F4 of the second nano sheets 130 may directly contact the isolation wall 110 and may not be covered by the second gate 150. The second gate 150 may be referred to as a tri-gate or an around-gate. The second transistor array TR2 may be an array of tri-gate nano sheet transistors.

The second nano sheets 130 may be made of a monocrystalline material. The second nano sheets 130 may be a semiconductor material formed by epitaxial growth. The second nano sheets 130 may include a silicon layer or a silicon germanium layer. The second nano sheets 130 may include an oxide semiconductor material such as IGZO. Each of the second nano sheets 130 may have a thickness of 50 to 300 Å. In an embodiment, the first nano sheets 120 may be silicon nano sheets, and the second nano sheets 130 may be silicon germanium nano sheets.

The second gate 150 may include a conductive stack including a plurality of conductive materials. For example, the second gate 150 may include a stack of a second around-gate layer 151, a second liner gate layer 152, and a second low resistivity gate layer 153. The second around-gate layer 151 may cover the upper surface F1, the lower surface F2, and the first side F3 of the second nano sheets 130. The second around-gate layer 151, the second liner gate layer 152, and the second low resistivity gate layer 153 may include a semiconductor material, a metal material, a metal nitride, a metal silicide, or a combination thereof. The second around-gate layer 151 may include TiN, TiSiN, TiAlN, TiCN, TaN, TaSiN, TaAlN, or TaCN. In an embodiment, the second around-gate layer 151 may include titanium nitride, the second liner gate layer 152 may include polysilicon, and the second low-resistivity gate layer 153 may include tungsten. In another embodiment, the second around-gate layer 151 may include a high work function material having a work function of about 4.5 eV or more or a P-type work function material.

A second gate dielectric layer 154 may be formed between the second gate 150 and the second nano sheets 130. The second gate dielectric layer 154 may cover the surface of the substrate 101. The second gate dielectric layer 154 may include a multilayer structure disposed between the second nano sheets 130 and the second around-gate layer 151. For example, the second gate dielectric layer 154 may include a stack of a second interfacial layer 154A and a second high-k layer 154B. The second gate dielectric layer 154 may not include a dipole inducing layer, and thus the second gate dielectric layer 154 may be dipole-free. The second interfacial layer 154A may include silicon oxide or silicon oxynitride, and the second high-k layer 154B may include a hafnium-based material. The second high-k layer 154B may include $HfO_2$, HfON, HfSiO, HfSiON, HfZrO, or HfZrON.

The second transistor array TR2 may further include second buried source/drain layers 161 formed in the substrate 101. The second buried source/drain layers 161 may be formed in the substrate 101 on both sides of the second nano sheet stack 130P in the third direction D3. The second transistor array TR2 may further include second common source/drain layers 161S commonly connected to both end portions of the second nano sheets 130. The second common source/drain layers 161S may extend vertically along the first direction D1 to be connected to the second buried source/drain layers 161. In another embodiment, the second common source/drain layers 161S may extend vertically through the end portions of the second nano sheets 130. The second common source/drain layers 161S may include an epitaxial silicon layer epitaxially grown from the end portions of the second nano sheets 130. The second common source/drain layers 161S may be respectively connected to both end portions of the second nano sheets 130. The second buried source/drain layers 161 and the second common source/drain layers 161S may include a semiconductor material, a metal, a metal nitride, a metal silicide, or a combination thereof. In an embodiment, the second buried source/drain layers 161 may include cobalt silicide, nickel silicide, titanium silicide, tungsten silicide, or molybdenum silicide. In an embodiment, the second common source/drain layers 161S may include polysilicon.

A separation layer 111 may be formed in the substrate 101, and the separation layer 111 may contact the first buried source/drain layers 160 and the second buried source/drain layers 161. The separation layer 111 may be formed by a shallow trench isolation (STI) process. The separation layer 111 may be a dielectric separation layer. For example, the separation layer 111 may include silicon oxide, silicon nitride, or a combination thereof. The separation layer 111 may have a trench type isolation structure. The separation layer 111 and the isolation wall 110 may be interconnected.

A capping layer 170 may be formed on both the first gate 140 and the second gate 150. The capping layer 170 may include a dielectric material such as silicon oxide or silicon nitride.

The first gate 140 and the second gate 150 may be spaced apart from each other by the isolation wall 110.

The semiconductor device 100 as described above is a dual-channel nano sheet transistor, and the dual-channel may include first nano sheets 120 and the second nano sheets 130. The first transistor array TR1 may be an array of first nano sheet transistors, and the second transistor array TR2 may be an array of second nano sheet transistors. The first nano sheets 120 may be a channel of an N-channel transistor, and the second nano sheets 130 may be a channel of a P-channel transistor. The first transistor array TR1 may be an array of tri-gate N-channel nano sheet transistors, and the second transistor array TR2 may be an array of tri-gate P-channel nano sheet transistors.

The first nano sheets 120 may be referred to as an N-channel layer. The first nano sheets 120 may include a silicon layer or a silicon epitaxial layer. The first nano sheets 120 may be referred to as silicon nano sheets. The second nano sheets 130 may be referred to as a P-channel layer. The second nano sheets 130 may include a silicon germanium layer or a silicon germanium epitaxial layer. The second nano sheets 130 may be referred to as silicon germanium nano sheets. The first and second nano sheets 120 and 130 may be horizontally oriented along the third direction D3 to be parallel to the surface of the substrate 101. The first nano sheets 120 and the second nano sheets 130 may be formed by epitaxial growth.

Referring back to FIG. 2D, the first nano sheets 120 and the second nano sheets 130 may be spaced apart from each other by the isolation wall 110. The first nano sheets 120 and the second nano sheets 130 with the isolation wall 110 interposed therebetween may be positioned at different levels. The first nano sheets 120 and the second nano sheets 130 may be positioned at different horizontal levels. For example, the first nano sheet 120 of the lowest level may be located at the first horizontal level L1, and the second nano sheet 130 of the lowest level may be located at the second horizontal level L2. The first horizontal level L1 may refer to a level higher than the second horizontal level L2. As such, the first nano sheets 120 and the second nano sheets 130 may not be disposed at the same horizontal level. The second nano sheet 130 at the lowest level of the second nano sheets 130 may directly contact the substrate 101. The first nano sheet 120 of the lowest level of the first nano sheets 120 may be spaced apart from the substrate 101.

The first nano sheets 120 and the second nano sheets 130 may have the same height (or thickness). For example, the first nano sheets 120 may have a first height H1, and the second nano sheets 130 may have a second height H2. The first height H1 and the second height H2 may refer to a height (or thickness) in the first direction D1. The first height H1 and the second height H2 may be the same. The first height H1 of the first nano sheets 120 and the second height H2 of the second nano sheets 130 may be 50 to 300 Å.

A first interval S1 between the first nano sheets 120 and a second interval S2 between the second nano sheets 130 may be the same. The first interval S1 between the first nano sheets 120 and the second interval S2 between the second nano sheets 130 may be 50 to 300 Å.

The second interval S2 between the second nano sheets 130 and the first height H1 of the first nano sheets 120 may be the same. The first interval S1 between the first nano sheets 120 and the second height H2 of the second nano sheets 130 may be the same.

FIGS. 3A to 3D are diagrams illustrating a dual channel nano sheet according to other embodiments of the present invention.

Figure 3A:
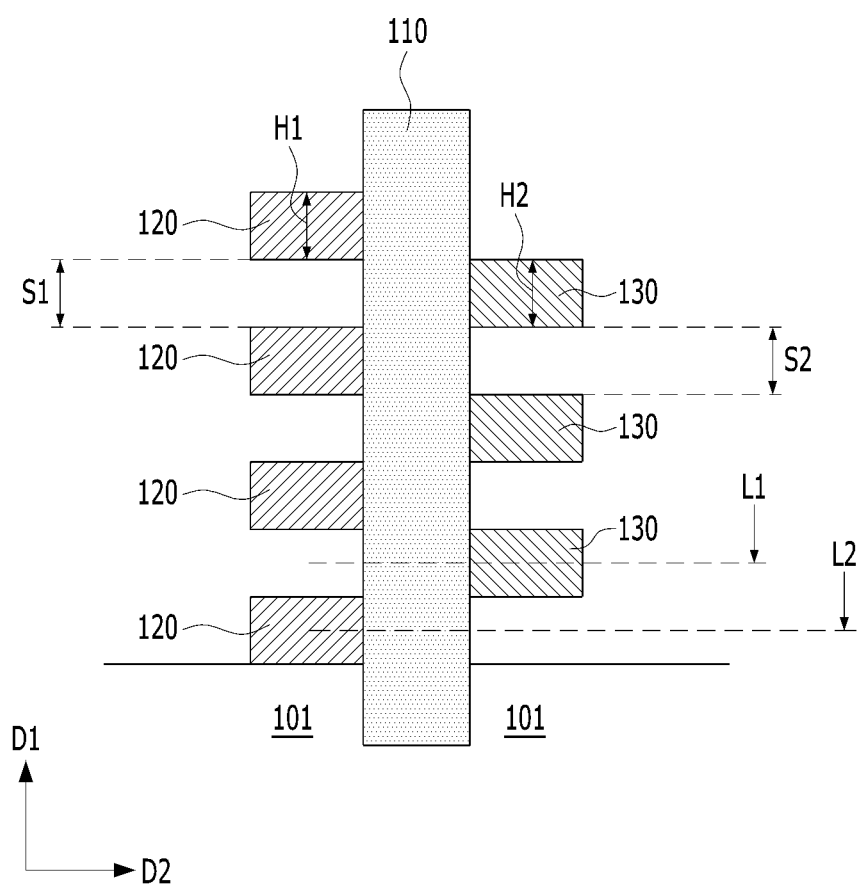
FIGS. 3A to 3D are diagrams illustrating a dual-channel nano sheet according to other embodiments of the present invention.

Referring to FIG. 3A, the first nano sheets 120 and the second nano sheets 130 disposed with the isolation wall 110 interposed therebetween may be positioned at different levels. The first nano sheets 120 and the second nano sheets 130 may be positioned at different horizontal levels. For example, the first nano sheet 120 of the lowest level may be located at the second horizontal level L2, and the second nano sheet 130 of the lowest level may be located at the first horizontal level L1. The first horizontal level L1 may refer to a level higher than the second horizontal level L2. As such, the first nano sheets 120 and the second nano sheets 130 may not be positioned at the same horizontal level. The first nano sheet 120 at the lowest level may directly contact the substrate 101, and the second nano sheet 130 at the lowest level may be spaced apart from the substrate 101. The first nano sheets 120 and the second nano sheets 130 may have the same thickness.

Figure 3B:
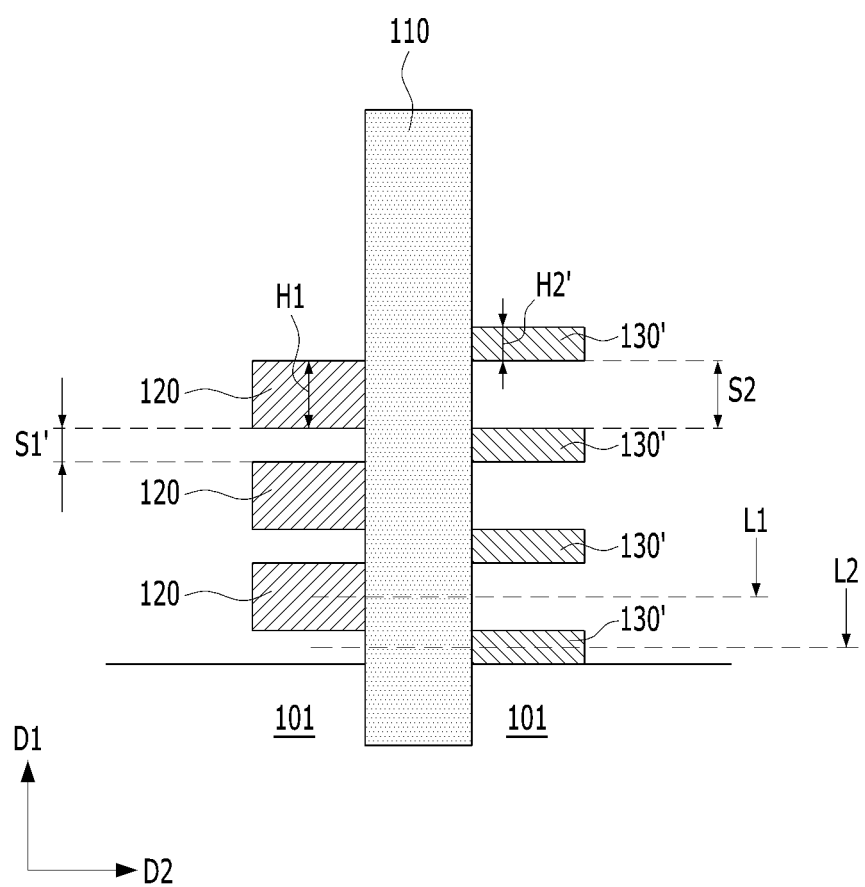

Referring to FIG. 3B, the first nano sheets 120 and the second nano sheets 130' with the isolation wall 110 interposed therebetween may be positioned at different levels. The first nano sheets 120 and the second nano sheets 130' may be positioned at different horizontal levels. For example, the first nano sheet 120 of the lowest level may be located at the first horizontal level L1, and the second nano sheet 130' may be located at the second horizontal level L2. The first horizontal level L1 may refer to a level higher than the second horizontal level L2. As such, the first nano sheets 120 and the second nano sheets 130' may not be positioned at the same horizontal level. The second nano sheets 130' at the lowest level among the second nano sheets 130' may directly contact the substrate 101. The first nano sheet 120 at the lowest level among the first nano sheets 120 may be spaced apart from the substrate 101.

The first nano sheets 120 and the second nano sheets 130' may have different heights (or thicknesses). For example, the first nano sheets 120 may have a first height H1, the second nano sheets 130' may have a second height H2', and the first height H1 may be greater than the second height H2'. The first height H1 of the first nano sheets 120 may be 50 to 300 Å.

The first interval S1' between the first nano sheets 120 and the second interval S2 between the second nano sheets 130' may be different from each other. For example, the first interval S1' between the first nano sheets 120 may be smaller than the second interval S2 between the second nano sheets 130'. The second interval S2 of the second nano sheets 130' may be 50 to 300 Å.

The second interval S2 between the second nano sheets 130' and the first height H1 of the first nano sheets 120 may be the same. A first interval S1' between the first nano sheets 120 and the second height H2' of the second nano sheets 130' may be the same.

In another embodiment, the thickness of the second nano sheets 130 and 130' may be adjusted according to required threshold voltage. For example, the height of the second nano sheets 130 may be 50 to 80 Å if a P-channel transistor requires a high threshold voltage. If a P-channel transistor requires a low threshold voltage, the height of the second nano sheets 130 and 130' may be 80 to 300 Å. As the height of the second nano sheets 130 and 130' increases, the flat-band voltage shifts more in a positive direction, thereby further reducing the threshold voltage of the P-channel transistor.

Figure 3C:
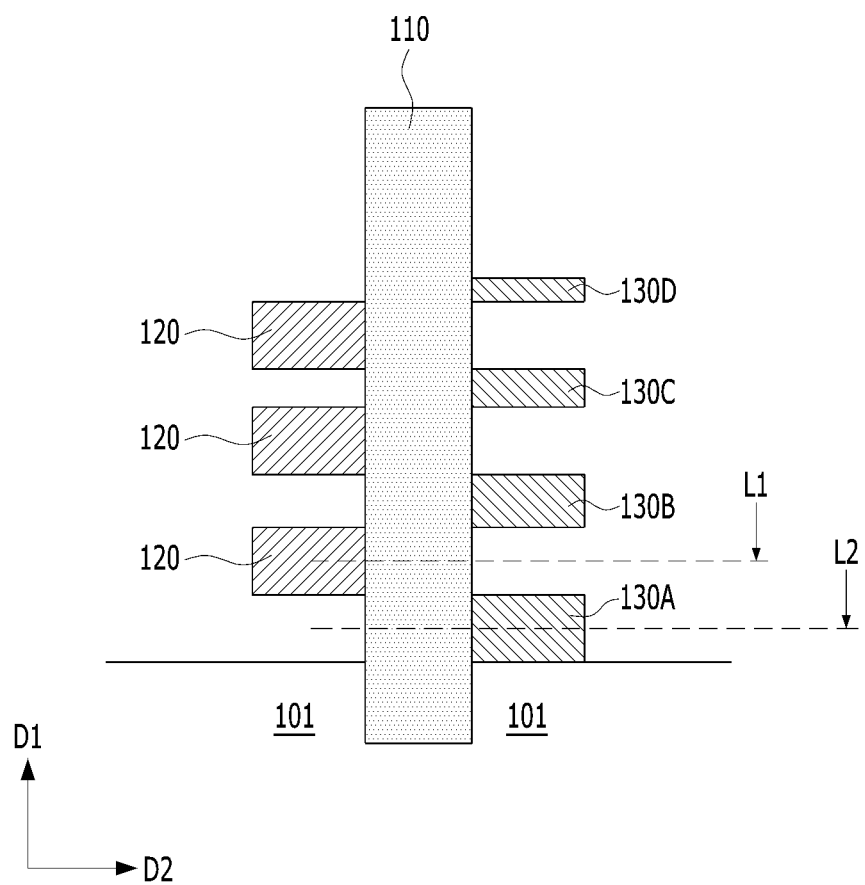

Referring to FIG. 3C, the first nano sheets 120 and the second nano sheets 130A, 130B, 130C, and 130D positioned with the isolation wall 110 interposed therebetween may be positioned at different levels. The first nano sheets 120 and the second nano sheets 130A, 130B, 130C, and 130D may be positioned at different horizontal levels. For example, the first nano sheet 120 of the lowest level may be positioned at the first horizontal level L1, and the second nano sheet 130A at the lowest level may be positioned at the second horizontal level L2. The first horizontal level L1 may refer to a level higher than the second horizontal level L2. As such, the first nano sheets 120 and the second nano sheets 130A, 130B, 130C, and 130D may not be positioned at the same horizontal level. The second nano sheet 130A of the lowest level may directly contact the substrate 101. The first nano sheet 120 at the lowest level among the first nano sheets 120 may be spaced apart from the substrate 101.

The first nano sheets 120 may have the same height. The second nano sheets 130A, 130B, 130C, and 130D may have different heights from each other. The height may be gradually lowered from the second nano sheet 130A of the lowest level toward the second nano sheet 130D of the highest level, that is, along the first direction D1. The height of the second nano sheet 130A of the lowest level may be the largest, and the height of the second nano sheet 130D of the highest level may be the smallest. The height of the second nano sheet 130D of the highest level may be 50 to 80 Å, and the height of the second nano sheet 130A of the lowest level may be 80 to 300 Å. For example, the second nano sheets 130C and 130D may be channels of a P-channel transistor requiring a high threshold voltage, and the second nano sheets 130A and 130B may be a P-channel transistor requiring a low threshold voltage.

In another embodiment, the height may be gradually increased from the second nano sheet 130A of the lowest level toward the second nano sheet 130D of the highest level, that is, along the first direction D1. The height of the second nano sheet 130A of the lowest level may be the smallest, and the height of the second nano sheet 130D of the highest level may be the largest.

Figure 3D:
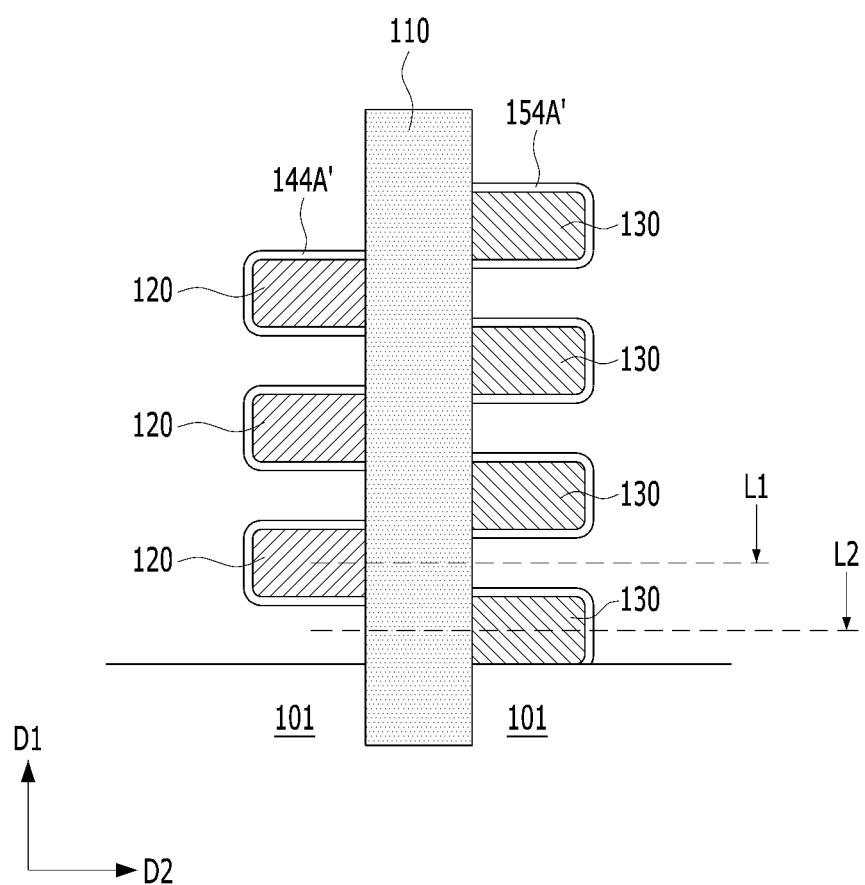

Referring to FIG. 3D, the first nano sheets 120 and the second nano sheets 130 with the isolation wall 110 interposed therebetween may be positioned at different levels. The first nano sheets 120 and the second nano sheets 130 may be positioned at different horizontal levels. For example, the first nano sheet 120 of the lowest level may be located at the first horizontal level L1, and the second nano sheet 130 of the lowest level may be located at the second horizontal level L2. The first horizontal level L1 may refer to a level higher than the second horizontal level L2. As such, the first nano sheets 120 and the second nano sheets 130 may not be disposed at the same horizontal level. The second nano sheet 130 at the lowest level may directly contact the substrate 101, and the first nano sheet 120 at the lowest level may be spaced apart from the substrate 101.

The interfacial layers 144A' and 154A' may be formed by selectively oxidizing the surfaces of the first nano sheets 120 and the surfaces of the second nano sheets 130. The first nano sheets 120 and the second nano sheets 130 may have rounded corners. Subsequently, as referenced in FIG. 2A, high-k layers 144B and 154B may be formed on the interfacial layers 144A' and 154A', respectively.

FIGS. 4 to 18 are diagrams illustrating a method for fabricating a semiconductor device according to an embodiment of the present invention. FIGS. 4 to 18 are cross-sectional views taken along lines A-A', B-B', and C-C' of FIG. 1B to illustrate the method for fabricating a semiconductor device according to an embodiment of the present invention.

As shown in FIG. 4, an alternating stack 12 may be formed on the substrate 11. The substrate 11 may be a material suitable for semiconductor processing. The substrate 11 may include at least one of a conductive material, a dielectric material, and a semiconductor material. The substrate 11 may include a semiconductor substrate. The substrate 11 may be made of a material containing silicon. The substrate 11 may include silicon, monocrystalline silicon, polysilicon, amorphous silicon, silicon germanium, monocrystalline silicon germanium, polycrystalline silicon germanium, carbon doped silicon, a combination thereof, or a multilayer thereof. The substrate 11 may include a compound semiconductor substrate such as GaAs. The substrate 11 may include a silicon on insulator (SOI) substrate. As referenced in FIGS. 1A and 1B, the substrate 11 may include a first transistor array TR1 and a second transistor array TR2.

Prior to forming the alternating stack 12, the surface of the substrate 11 may be exposed to a cleaning process. Natural oxides and impurities on the surface of the substrate 11 may be removed by the cleaning process. The cleaning process may include a dry cleaning process or a wet cleaning process. Hydrogen may be supplied to the dangling bonds on the surface of the substrate 11 through the cleaning process, thereby suppressing the growth of native oxides.

The alternating stack 12 may include at least one first semiconductor layer 13 and at least one second semiconductor layer 14. In the alternating stack 12, a plurality of first semiconductor layers 13 and a plurality of second semiconductor layers 14 may be alternately stacked. The first semiconductor layers 13 and the second semiconductor layers 14 may be grown epitaxially as single crystals. The lowermost layer of the alternating stack 12 may be the first semiconductor layer 13, and the uppermost layer of the alternating stack 12 may be the first semiconductor layer 13. The first semiconductor layer 13 and the second semiconductor layer 14 may be made of different materials. For example, the first semiconductor layer 13 may include a silicon germanium layer, and the second semiconductor layer 14 may include a silicon layer. In another embodiment, the first semiconductor layer 13 may include a silicon layer, and the second semiconductor layer 14 may include a silicon germanium layer. The first semiconductor layer 13 and the second semiconductor layer 14 may have the same thickness. In another embodiment, the first semiconductor layer 13 may be thinner than the second semiconductor layer 14, or the first semiconductor layer 13 may be thicker than the second semiconductor layer 14. The first semiconductor layer 13 and the second semiconductor layer 14 may be referred to as a first channel layer and a second channel layer, respectively.

In an embodiment, the alternating stack 12 may be formed by alternately stacking silicon germanium layers and silicon layers. The silicon germanium layers and the silicon layers may be epitaxially grown into single crystals. The thickness of the silicon germanium layer may be 50 to 300 Å, and the thickness of the silicon layer may be 50 to 300 Å. The number of times the silicon germanium layers and the silicon layers are alternately stacked may be adjusted according to a target driving current value of the transistors.

A hard mask layer 15 may be formed on the alternating stack 12. The hard mask layer 15 may have an etch selectivity with respect to the alternating stack 12. The hard mask layer 15 may be used as an etch barrier or a mask for etching the alternating stack 12. The hard mask layer 15 may include, for example, silicon nitride. The hard mask layer 15 may be deposited in a single type chamber or a batch type chamber. In addition, the hard mask layer 15 may be deposited using thermal chemical vapor deposition (thermal CVD) or plasma chemical vapor deposition (Plasma CVD). The thickness of the hard mask layer 15 may be 500 to 1000 Å.

Subsequently, the hard mask layer 15 may be patterned using a photoresist pattern (not shown).

As shown in FIG. 5, a trench 16 may be formed by etching the alternating stack 12. To form the trench 16, the alternating stack 12 may be etched using the hard mask layer 15 as an etch barrier. Sheet stacks 12S may be formed by the trench 16. The sheet stacks 12S may include a plurality of sheet stacks 12N and 12P. The sheet stacks 12N and 12P may include a first sheet stack 12N and a second sheet stack 12P. In the first sheet stack 12N and the second sheet stack 12P, the first semiconductor layers 13 and the second semiconductor layers 14 may alternately stack in a vertical direction to the upper surface of the substrate 11. A trench 16 may be defined between the first sheet stack 12N and the second sheet stack 12P. A bottom surface of the trench 16 may extend into the substrate 11. The trench 16 may serve to separate the first sheet stack 12N and the second sheet stack 12P from each other.

Each of the first sheet stack 12N and the second sheet stack 12P may extend in a direction vertical to the substrate 11. A hard mask layer 15 may be positioned on the first sheet stack 12N and the second sheet stack 12P.

As described above, the sheet stacks 12S may include a first sheet stack 12N, a second sheet stack 12P, and a trench 16 between the first sheet stack 12N and the second sheet stack 12P.

Figure 6:
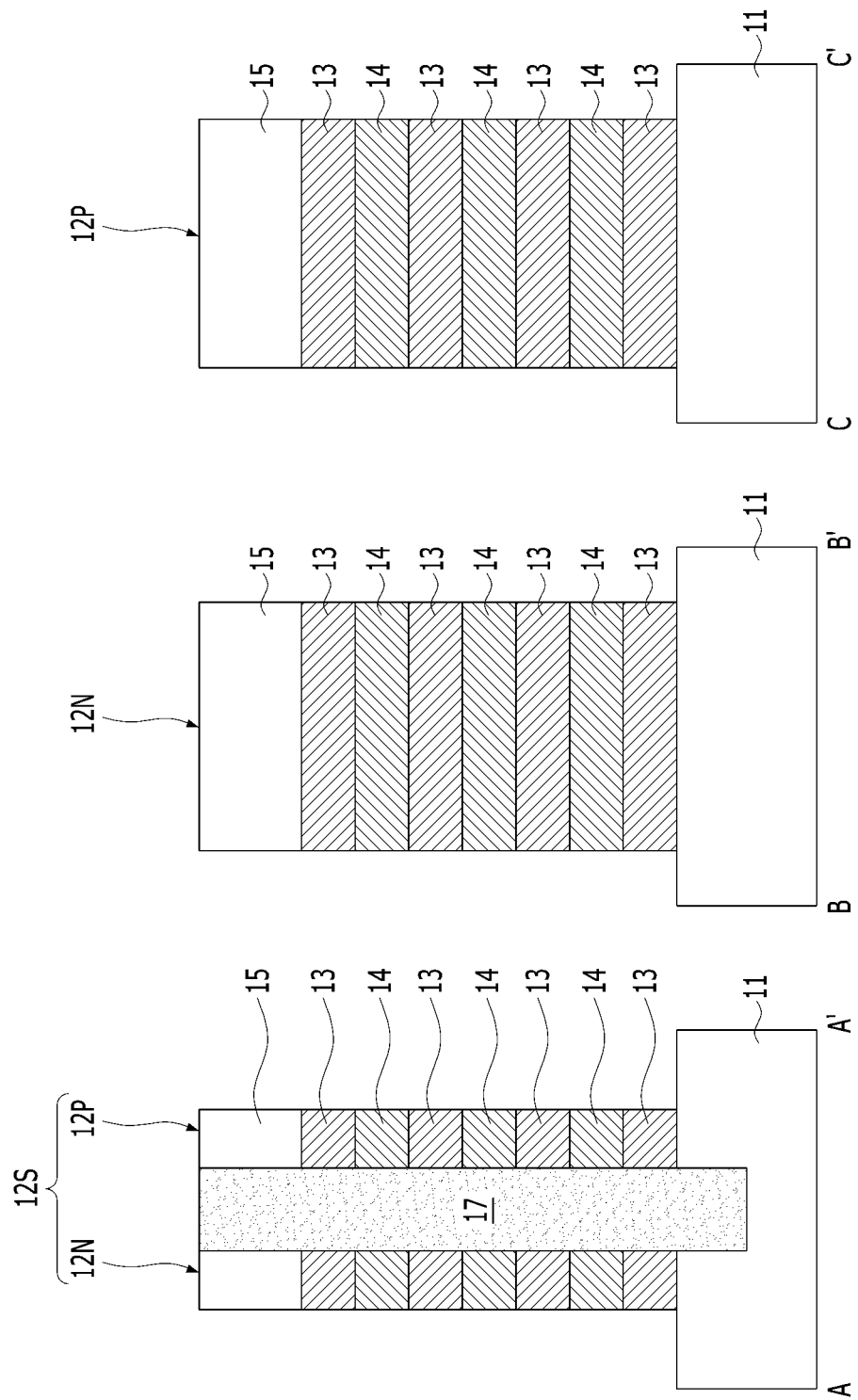

As shown in FIG. 6, an isolation wall 17 filling the trench 16 of the sheet stacks 12S may be formed. The isolation wall 17 may be deposited in a single type chamber or a batch type chamber. In addition, the isolation wall 17 may be deposited using thermal chemical vapor deposition (thermal CVD) or plasma chemical vapor deposition (Plasma CVD). The thickness of the isolation wall 17 may be 300 to 600 Å. The isolation wall 17 may include a dielectric material. For example, the isolation wall 17 may include, for example, silicon nitride, silicon oxide, or a combination thereof. In an embodiment, the isolation wall 17 may be formed of silicon nitride. The isolation wall 17 may also be referred to as a supporter. After masking (not shown) the first and second sheet stacks 12N and 12P to form the isolation wall 17, a dielectric material may be deposited to fill the trench 16. Subsequently, the dielectric material may be planarized until the upper surface of the hard mask layer 15 is exposed.

As described above, the sheet stacks 12S may include a first sheet stack 12N, a second sheet stack 12P, and an isolation wall 17 between the first sheet stack 12N and the second sheet stack 12P.

Figure 7:
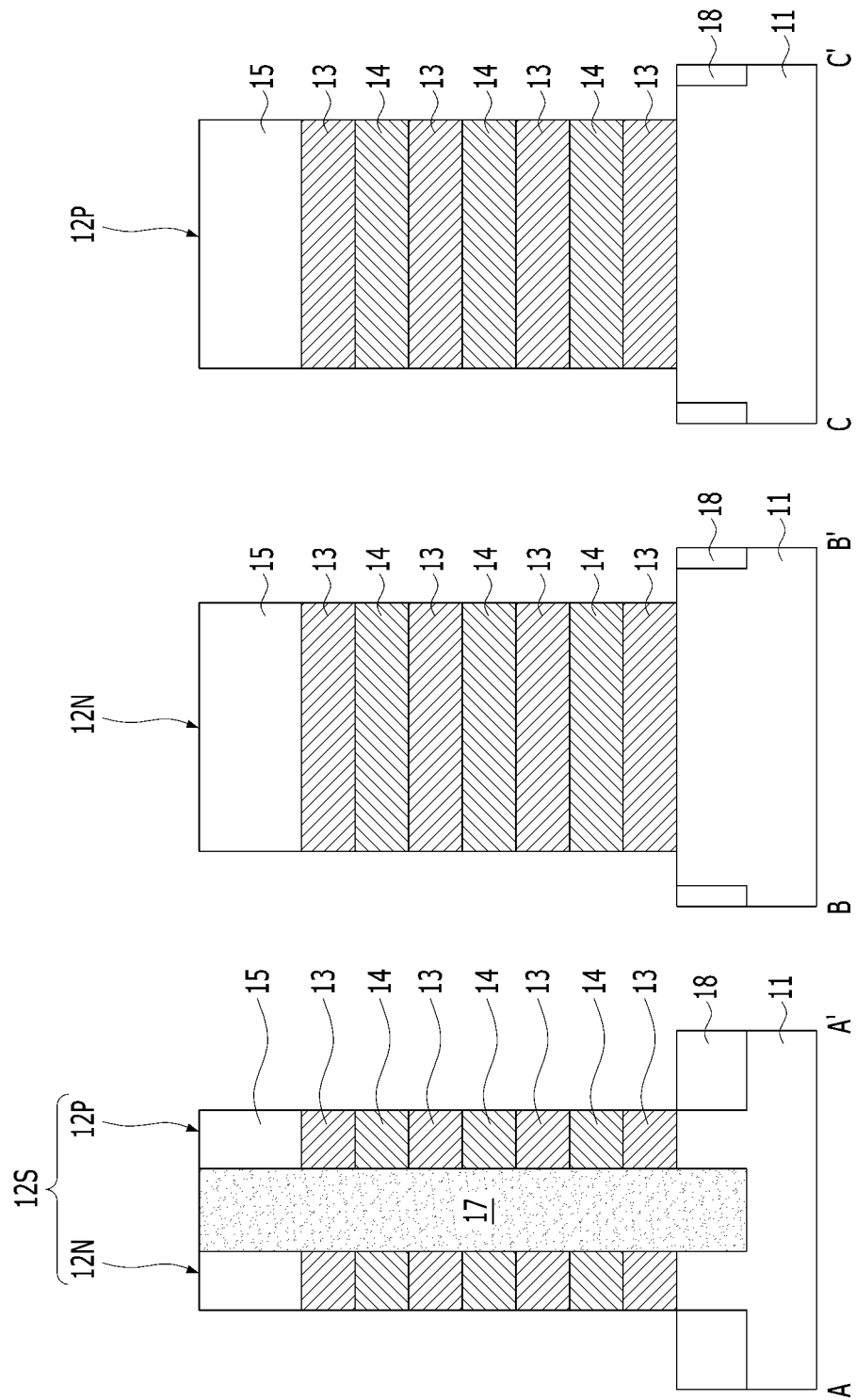

As shown in FIG. 7, a separation layer 18 may be formed in the substrate 11 on both sides of the sheet stacks 12S. The separation layer 18 may be formed by a shallow trench isolation (STI) process. The separation layer 18 may include silicon oxide, silicon nitride, or a combination thereof. The isolation wall 17 may be referred to as a pillar type isolation layer, and the separation layer 18 may be referred to as a trench type separation layer.

The isolation wall 17 and the separation layer 18 may be formed of the same material or different materials. For example, the isolation wall 17 may be silicon nitride, and the separation layer 18 may be silicon oxide.

In the A-A' direction, the separation layer 18 may be formed by being aligned on both sides of the sheet stack 12S. In the B-B' and C-C' directions, the separation layer 18 may be formed at a predetermined distance from the bottom edge of each of the first sheet stack 12N and the second sheet stack 12P. The A-A' direction may refer to the widths of the first sheet stack 12N and the second sheet stack 12P, and the B-B' direction and the C-C' direction may refer to the lengths the first sheet stack 12N and the second sheet stack 12P.

Figure 8:
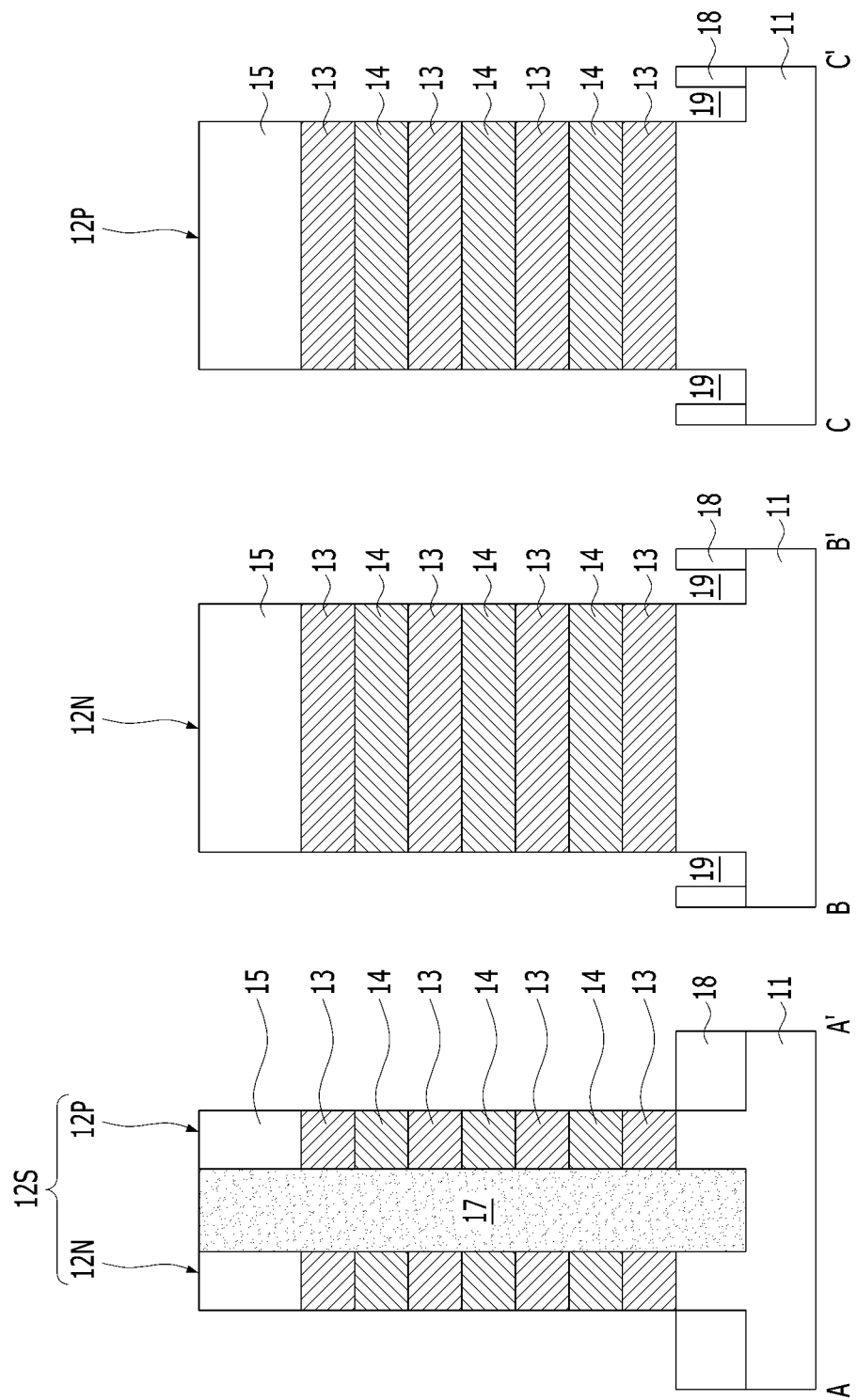

As shown in FIG. 8, the substrate 11 may be etched to a predetermined depth so as to be aligned with both sidewalls of the first and second sheet stacks 12N and 12P. Accordingly, a plurality of recesses 19 may be formed on the surface of the substrate 11. The recesses 19 may be formed on the substrate 11 on both sides of the sheet stack 12S along the B-B' and C-C' directions. For example, the surface of the substrate 11 between the first sheet stack 12N in the B-B' direction and the separation layer 18 may be etched to form the recesses 19. Also, the recesses 19 may be formed when the surface of the substrate 11 between the second sheet stack 12P and the separation layer 18 along the C-C' direction is etched. The recesses 19 may have the same depth, and the recesses 19 may be shallower than the separation layer 18. The recesses 19 may not be formed between the first sheet stack 12N and the separation layer 18 and between the second sheet stack 12P and the separation layer 18 in the A-A' direction.

Figure 9:
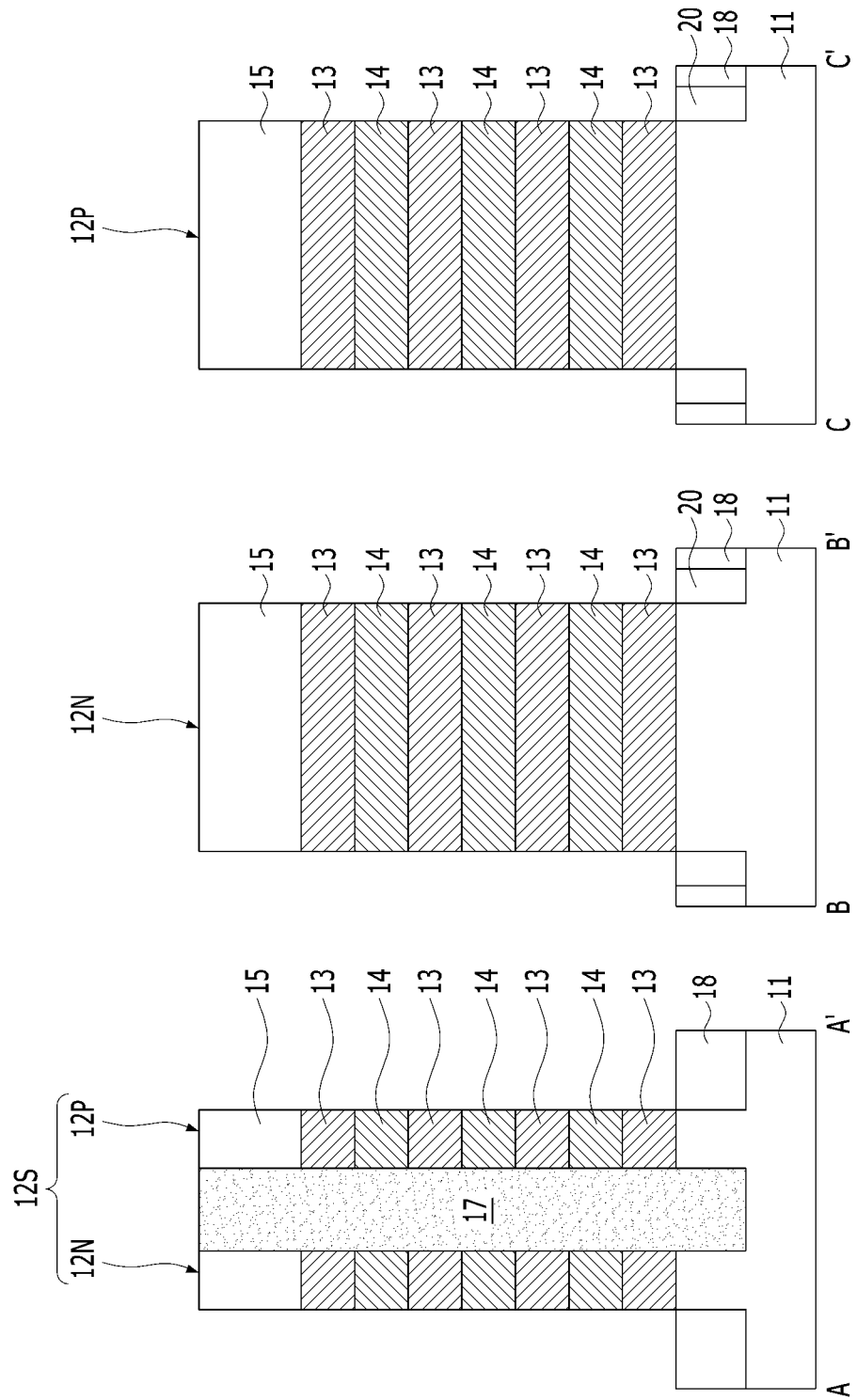

As shown in FIG. 9, the first and second buried source/drain layers 20 filling the recesses 19 may be formed. First buried source/drain layers 20 may be formed between the first sheet stack 12N and the separation layer 18. Second buried source/drain layers 20 may be formed between the second sheet stack 12P and the separation layer 18. The first and second buried source/drain layers 20 may be referred to as source/drain regions or buried bit lines. The first and second buried source/drain layers 20 may include a semiconductor material, a metal, a metal nitride, a metal silicide, or a combination thereof. The first and second buried source/drain layers may include cobalt silicide, nickel silicide, titanium silicide, tungsten silicide, or molybdenum silicide.

For example, to form the first and second buried source/drain layers 20, a metal layer may be deposited to fill the recesses 19, a heat treatment may be subsequently performed to form a metal silicide, and an unreacted metal layer may be removed. The metal layer filling the recesses 19 may be deposited only by a PVD (Physical Vapor Deposition) method. If CVD (Chemical Vapor Deposition) or ALD (Atomic Layer Deposition) is used for depositing the metal layer, the metal layer may be deposited on the sidewalls of the first and second sheet stacks 12N and 12P, thereby causing a silicide reaction of the semiconductor materials of the first and second sheet stacks 12N and 12P to occur in a subsequent thermal process. Using the PVD method may not result in the metal layers being deposited on sidewalls of the sheet stacks 12S due to PVD's straightness characteristic. A subsequent heat treatment may perform a rapid thermal annealing (RTA) process in a range of 500 to 700° C. The unreacted metal layer may be removed by a cleaning process.

Meanwhile, the first and second buried source/drain layers 20 may not be formed in the A-A' direction.

Figure 10:
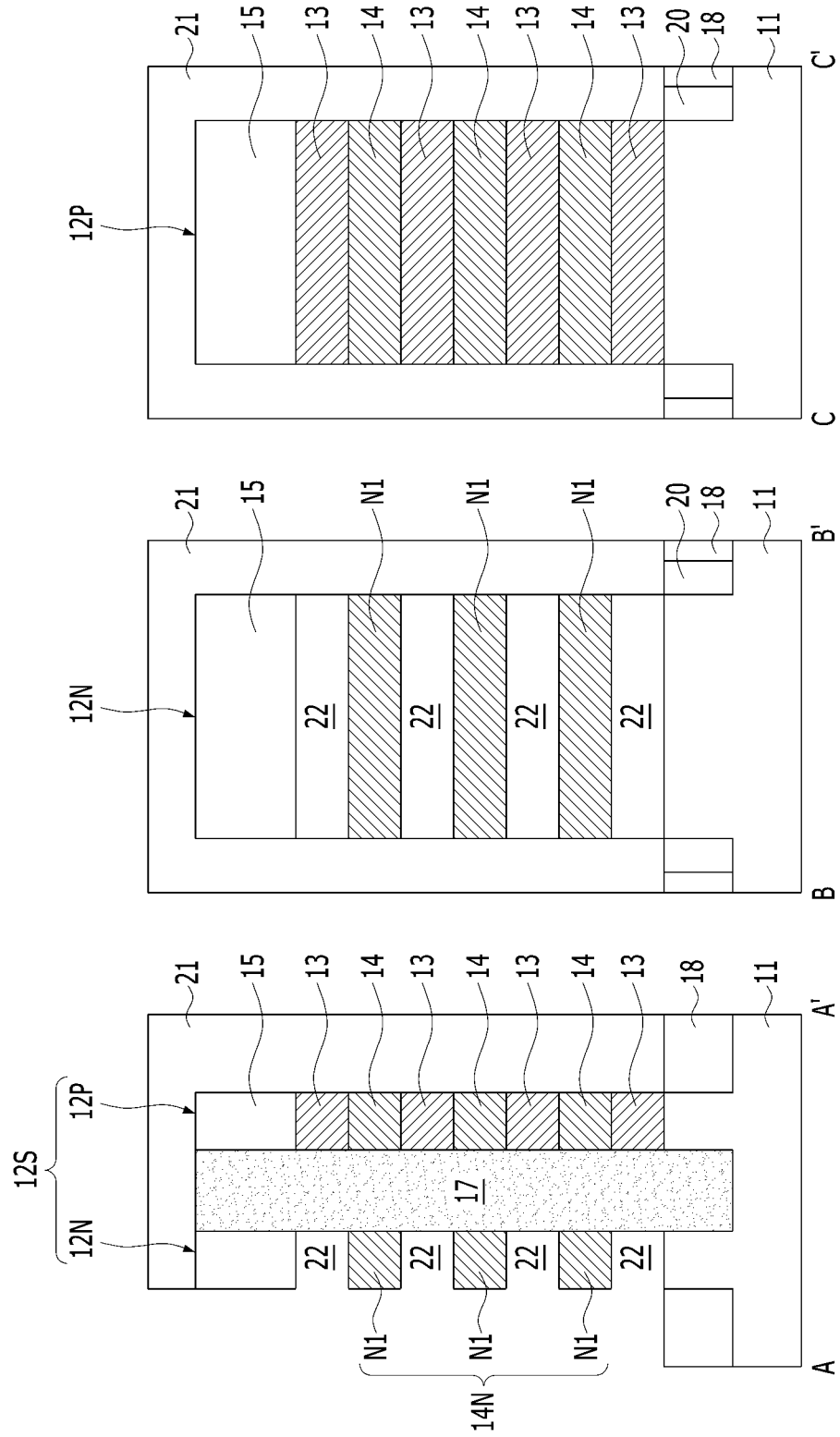

As shown in FIG. 10, a first mask layer 21 may be formed. The first mask layer 21 may include a photoresist pattern. The first mask layer 21 may selectively expose a portion of either the first sheet stack 12N or the second sheet stack 12P. For example, sidewalls of the first semiconductor layers 13 and the second semiconductor layers 14 of the first sheet stack 12N may be selectively exposed in the A-A' direction by the first mask layer 21. The second sheet stack 12P may be covered by the first mask layer 21 in the B-B' and C-C' directions. The first sheet stack 12N may be covered by the first mask layer 21 in the B-B' and C-C' directions.

Next, the first semiconductor layers 13 of the first sheet stack 12N may be selectively removed by using the first mask layer 21. Accordingly, first horizontal recesses 22 may be formed between the second semiconductor layers 14. The first semiconductor layers 13 may be selectively removed using wet etching.

The second semiconductor layers 14 vertically stacked with the first horizontal recesses 22 interposed therebetween may be abbreviated as 'first nano sheets N1'. A first nano sheet stack 14N including a plurality of first nano sheets N1 vertically stacked on the substrate 11 may be formed. The first nano sheets N1 may include silicon nano sheets.

Figure 11:
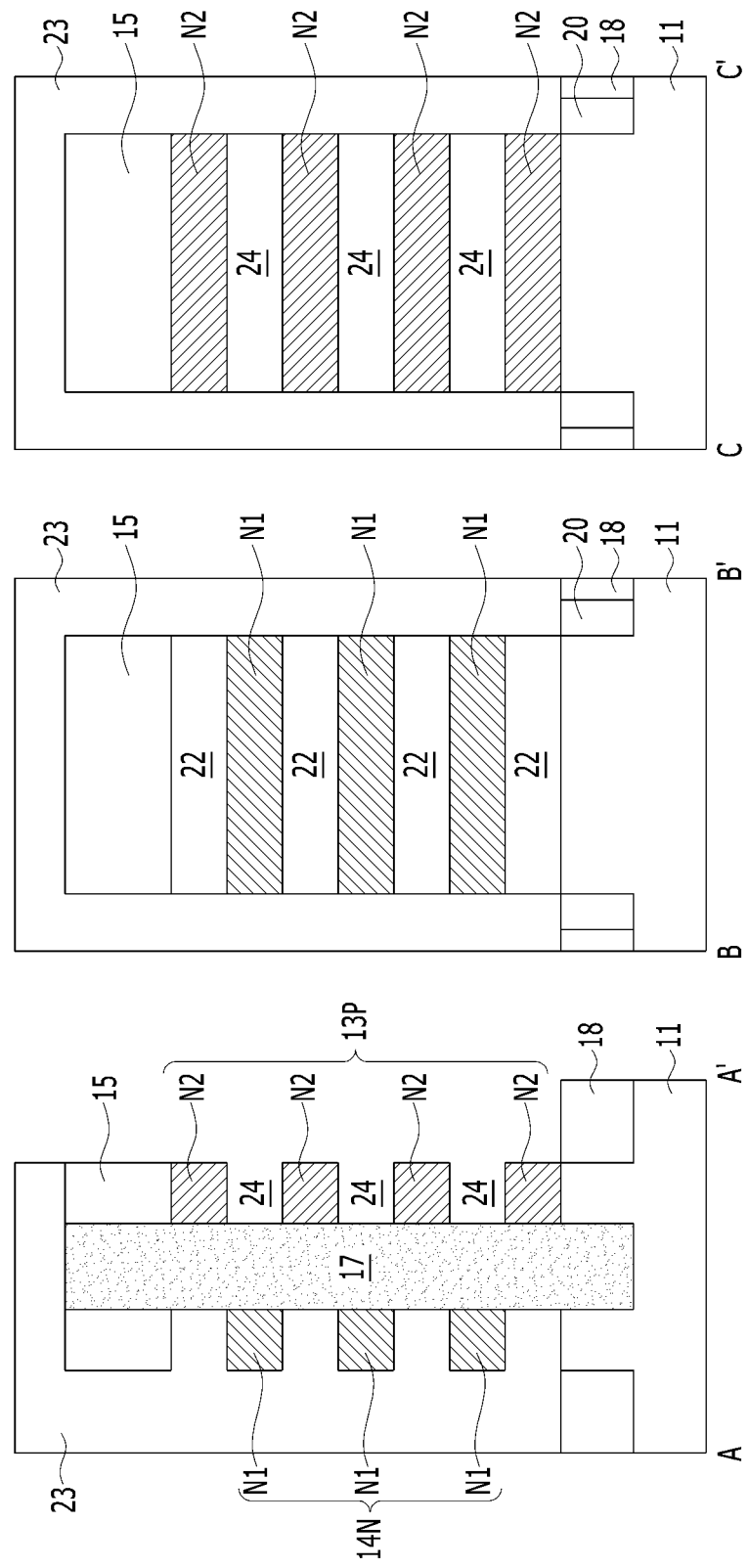

As shown in FIG. 11, a second mask layer 23 may be formed after the first mask layer 21 is removed. The second mask layer 23 may include a photoresist pattern. The second mask layer 23 may selectively expose portions of the second sheet stack 12P. For example, sidewalls of the first semiconductor layers 13 and the second semiconductor layers 14 of the second sheet stack 12P may be selectively exposed in the A-A' direction by the second mask layer 23. The second sheet stack 12P may be covered by the second mask layer 23 in both the B-B' and C-C' directions. All of the first nano sheets N1 and the first horizontal recesses 22 may be covered by the second mask layer 23 in the A-A', B-B', and C-C' directions.

Next, the second semiconductor layers 14 among the first semiconductor layers 13 and the second semiconductor layers 14 of the second sheet stack 12P may be selectively removed by using the second mask layer 23. Accordingly, second horizontal recesses 24 may be formed between the first semiconductor layers 13. The second semiconductor layers 14 may be removed by wet etching.

The first semiconductor layers 13 vertically stacked with the second horizontal recesses 24 interposed therebetween may be abbreviated as 'second nano sheets N2'. A second nano sheet stack 13P including a plurality of second nano sheets N2 vertically stacked on the substrate 11 may be formed. The second nano sheets N2 may include silicon germanium nano sheets.

Figure 12:
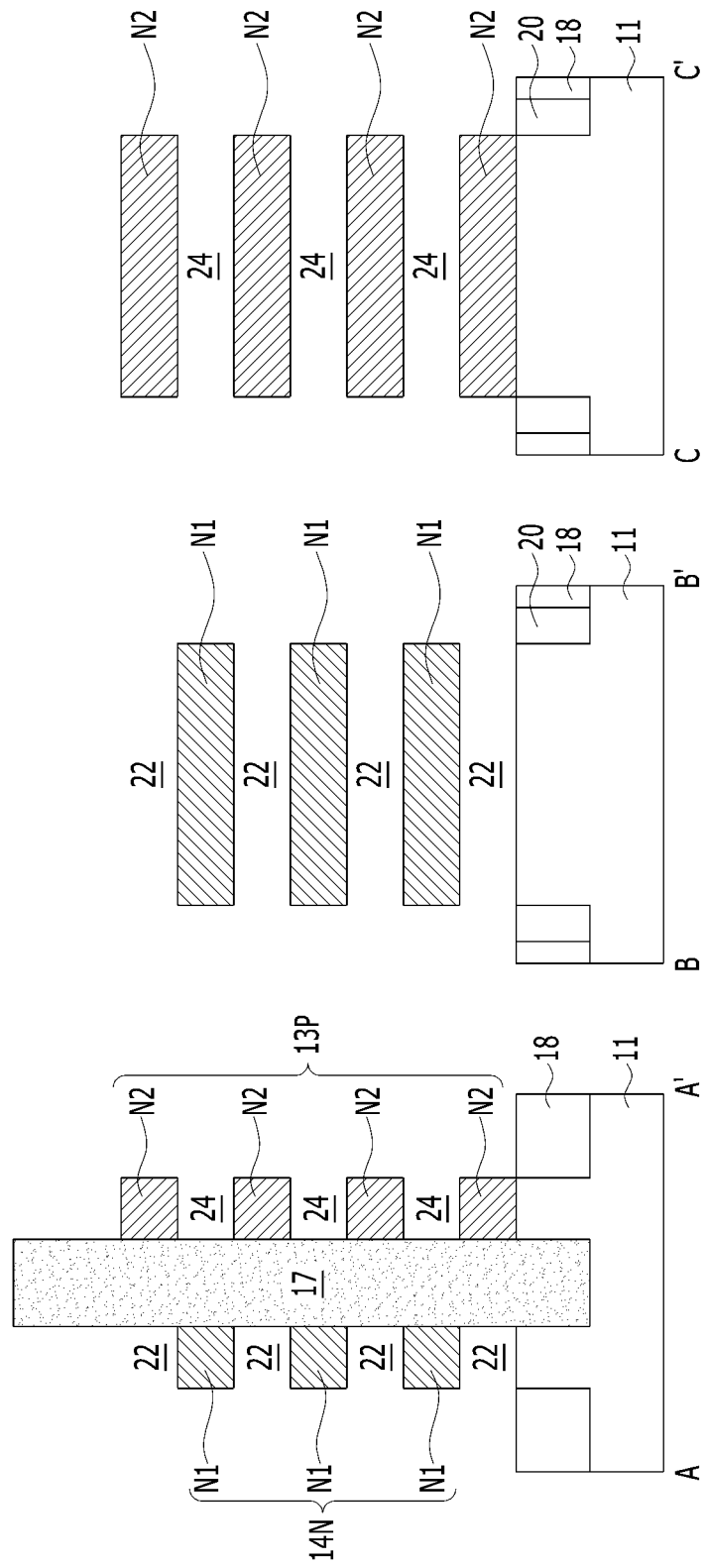

As shown in FIG. 12, the second mask layer 23 may be removed.

Through a series of processes described above, a plurality of first nano sheets N1 may be formed on one side of the isolation wall 17, and a plurality of second nano sheets N2 may be formed on the other side of the isolation wall 17. The isolation wall 17 may be disposed between the first nano sheets N1 and the second nano sheets N2. The isolation wall 17 may be used as a supporter of the first nano sheets N1 and the second nano sheets N2.

Each of the first and second nano sheets N1 and N2 may be referred to as nano sheet channels. The first and second nano sheets N1 and N2 may be horizontally oriented to be parallel to the surface of the substrate 11. The first nano sheets N1 and the second nano sheets N2 may be positioned at different horizontal levels. That is, the first nano sheets N1 and the second nano sheets N2 may not be positioned at the same horizontal level. The first horizontal recesses 22 may be formed between the first nano sheets N1, and the second horizontal recesses 24 may be formed between the second nano sheets N2.

Next, the hard mask layer 15 may be selectively removed. The hard mask layer 15 may be removed by wet etching. Lower structures may be damaged when the hard mask layer 15 is removed by dry etching.

Figure 13:
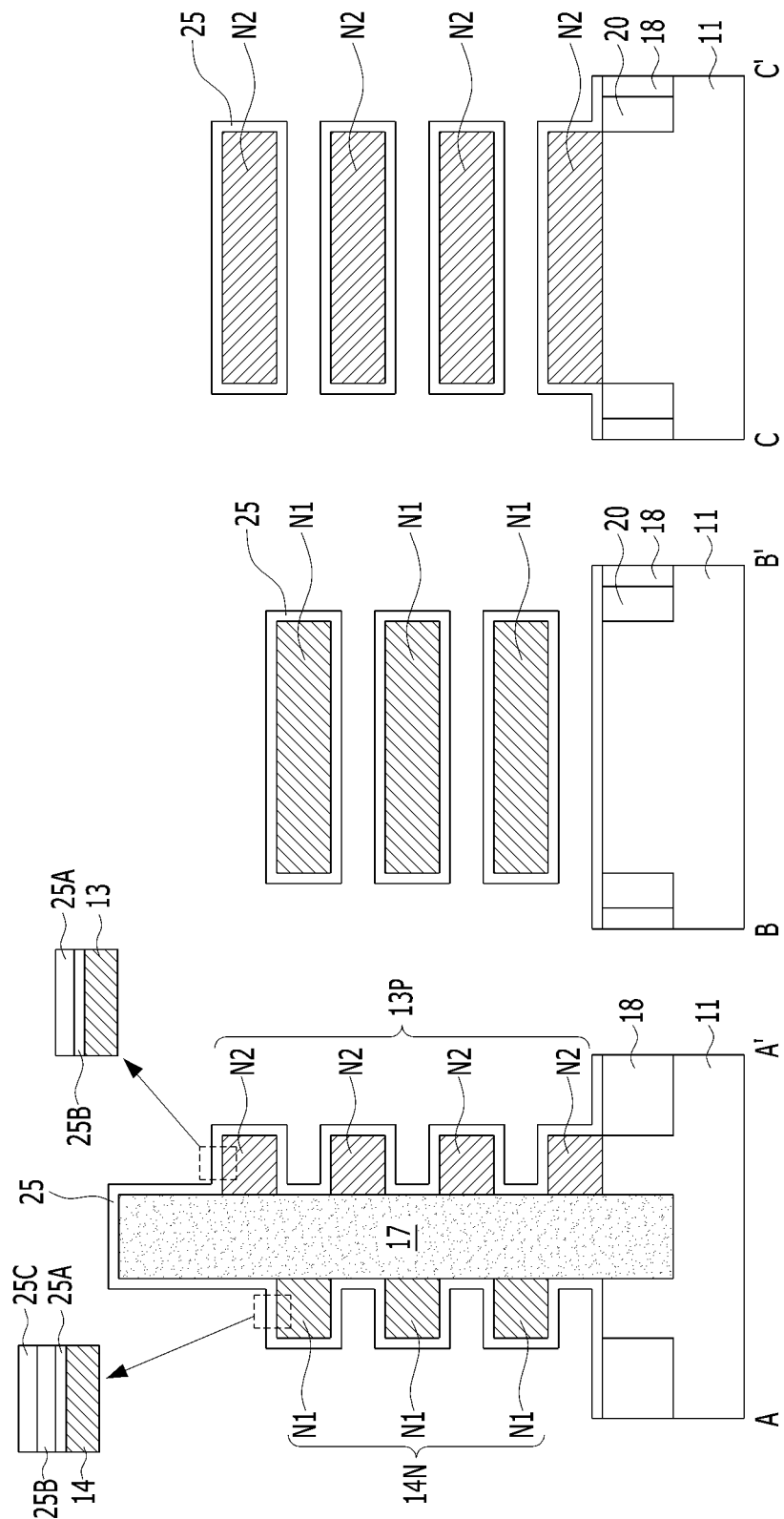

As shown in FIG. 13, a gate dielectric layer 25 may be formed. The gate dielectric layer 25 may include silicon oxide, silicon nitride, silicon oxynitride, a high-k material, or a combination thereof. For example, the gate dielectric layer 25 may include a stack of an interfacial layer 25A and a high-k layer 25B. The interfacial layer 25A may include silicon oxide or silicon oxynitride, and the high-k layer 25B may include a hafnium-based material. The high-k layer 25B may include $HfO_2$, HfON, HfSiO, HfSiON, HfZrO, or HfZrON.

The gate dielectric layer 25 may be formed on the surface of each of the first nano sheets N1 and the second nano sheets N2. A portion of the gate dielectric layer 25 may cover the exposed upper surface of the isolation wall 17.

The gate dielectric layer 25 formed on the first nano sheets N1 may include a stack of an interface layer 25A, a high-k layer 25B, and a dipole inducing layer 25C. The dipole inducing layer 25C may include lanthanum oxide or magnesium oxide. The gate dielectric layer 25 formed on the second nano sheets N2 may include a stack of the interface layer 25A and the high-k layer 25B. The gate dielectric layer 25 formed on the second nano sheets N2 may be dipole-free.

In the A-A' direction, the gate dielectric layer 25 may cover three surfaces of each of the first and second nano sheets N1 and N2. In the B-B' direction and the C-C' direction, the gate dielectric layer 25 may cover all surfaces of each of the first and second nano sheets N1 and N2.

Figure 14:
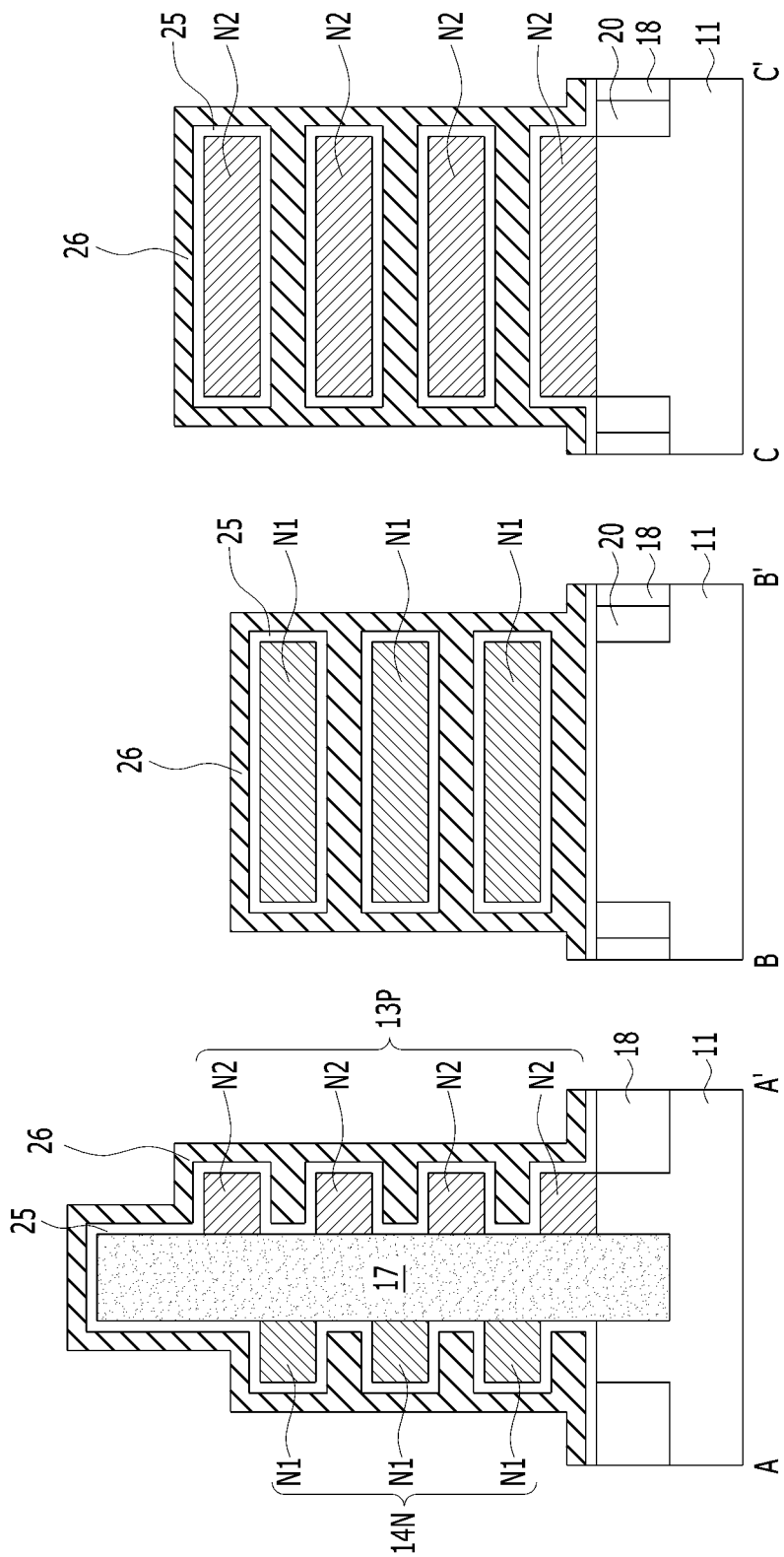

As shown in FIG. 14, a first gate layer 26 may be formed on the gate dielectric layer 25. The first gate layer 26 may include a metal-based material. The first gate layer 26 may include a metal nitride. The first gate layer 26 may include TiN, TiSiN, TiAlN, TiCN, TaN, TaSiN, TaAlN, or TaCN. The first gate layer 26 may be deposited by the ALD method to have a thickness of 20 to 100 Å. In an embodiment, the first gate layer 26 may include titanium nitride. The first gate layer 26 in the A-A' direction may cover three surfaces of each of the first and second nano sheets N1 and N2, and the first gate layer 26 may fully cover the first and second nano sheets N1 and N2 in the B-B' direction and C-C' direction. The first gate layer 26 may be filled in the first horizontal recesses 22 between the first nano sheets N1 and in the second horizontal recesses 24 between the second nano sheets N2.

Figure 15:
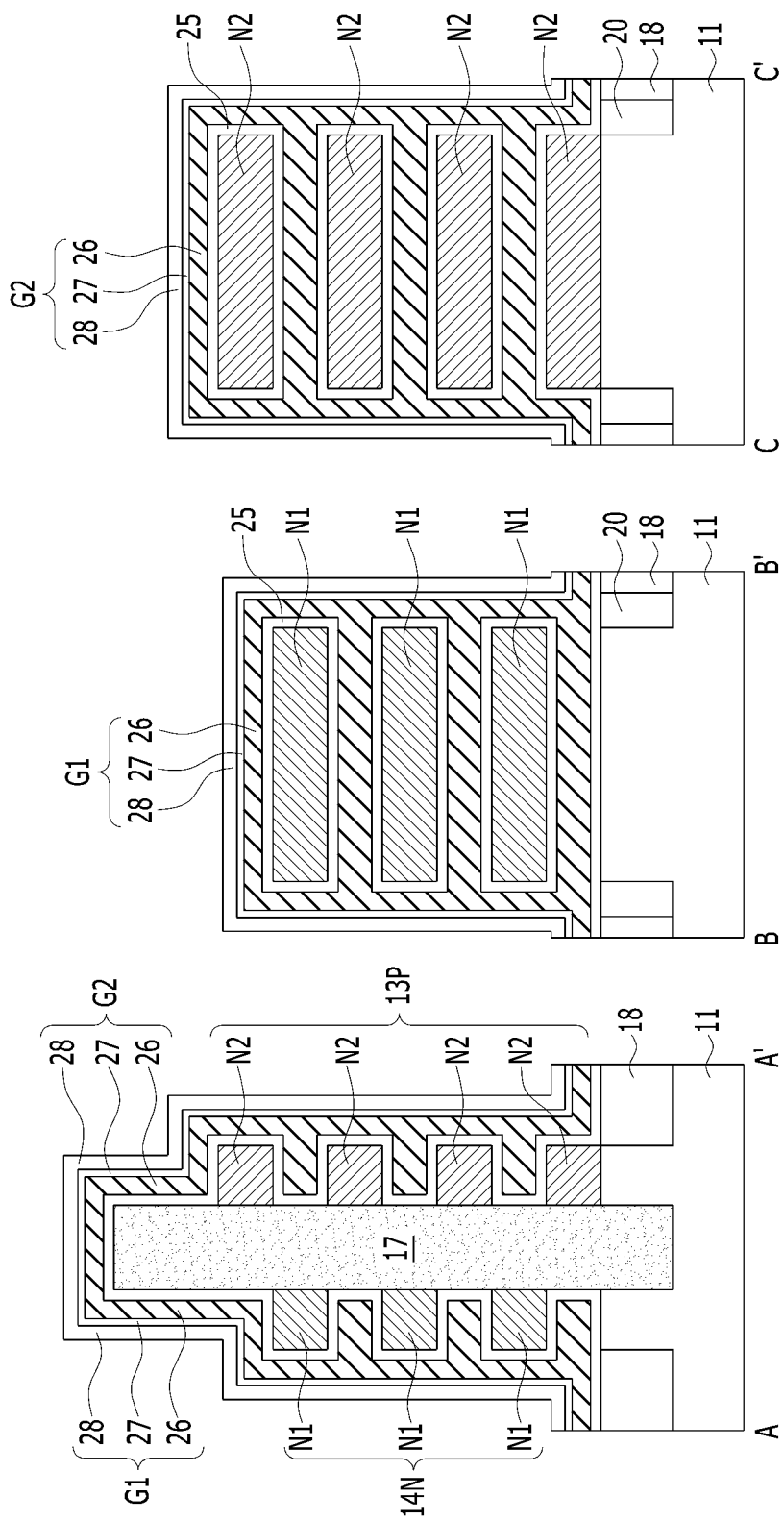

As shown in FIG. 15, a second gate layer 27 and a third gate layer 28 may be sequentially formed on the first gate layer 26. The second gate layer 27 may include a semiconductor material, and the third gate layer 28 may include a metal-based material. For example, the second gate layer 27 may include polysilicon, and the third gate layer 28 may include tungsten. In another embodiment, the third gate layer 28 may be formed by sequentially stacking titanium nitride and tungsten. The second gate layer 27 may be deposited to have a thickness of 200 to 500 Å using the CVD or ALD methods. The third gate layer 28 may be deposited to have a thickness of 200 to 400 Å using the CVD or ALD methods. The second gate layer 27 and the third gate layer 28 may not fully cover the first nano sheets N1 and the second nano sheets N2. That is, only the first gate layer 26 may surround the first nano sheets N1 and the second nano sheets N2.

Figure 16:
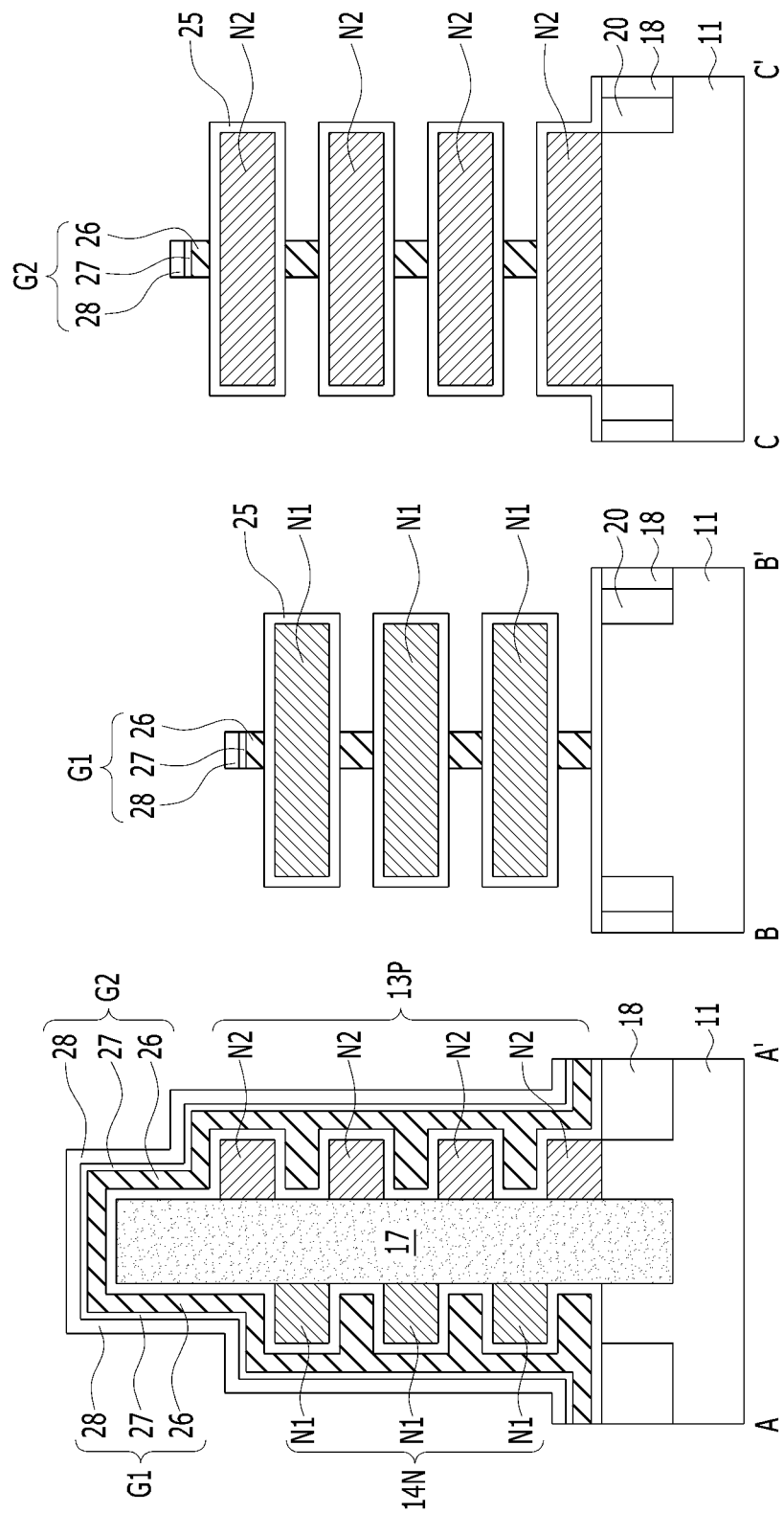

As shown in FIG. 16, a first gate G1 and a second gate G2 may be formed. To form the first gate G1 and the second gate G2, the third gate layer 28, the second gate layer 27, and the first gate layer 26 may be sequentially etched in the A-A' direction. The first gate G1 may be disposed around the first nano sheets N1 with the gate dielectric layer 25 interposed therebetween. The second gate G2 may be disposed around the second nano sheets N2 with the gate dielectric layer 25 interposed therebetween. The first gate layer 26 of the first gate G1 may be disposed around the first nano sheets N1 with the gate dielectric layer 25 interposed therebetween. The first gate layer 26 of the second gate G2 may be disposed around the second nano sheets N2 with the gate dielectric layer 25 interposed therebetween. The first gate G1 and the second gate G2 may extend in a direction vertical to the substrate 11. The first gate G1 and the second gate G2 may be referred to as 'a first vertical gate and second vertical gate', respectively. The first gate layer 26 of the first and second gates G1 and G2 may be referred to as an around-gate layer. The second gate layer 27 of the first gate G1 and the second gate G2 may be referred to as a liner gate layer. The third gate layer 28 of the first gate G1 and the second gate G2 may be referred to as a low-resistivity gate layer.

The first gate G1 and the second gate G2 may have a merged structure connected to each other.

Figure 17:
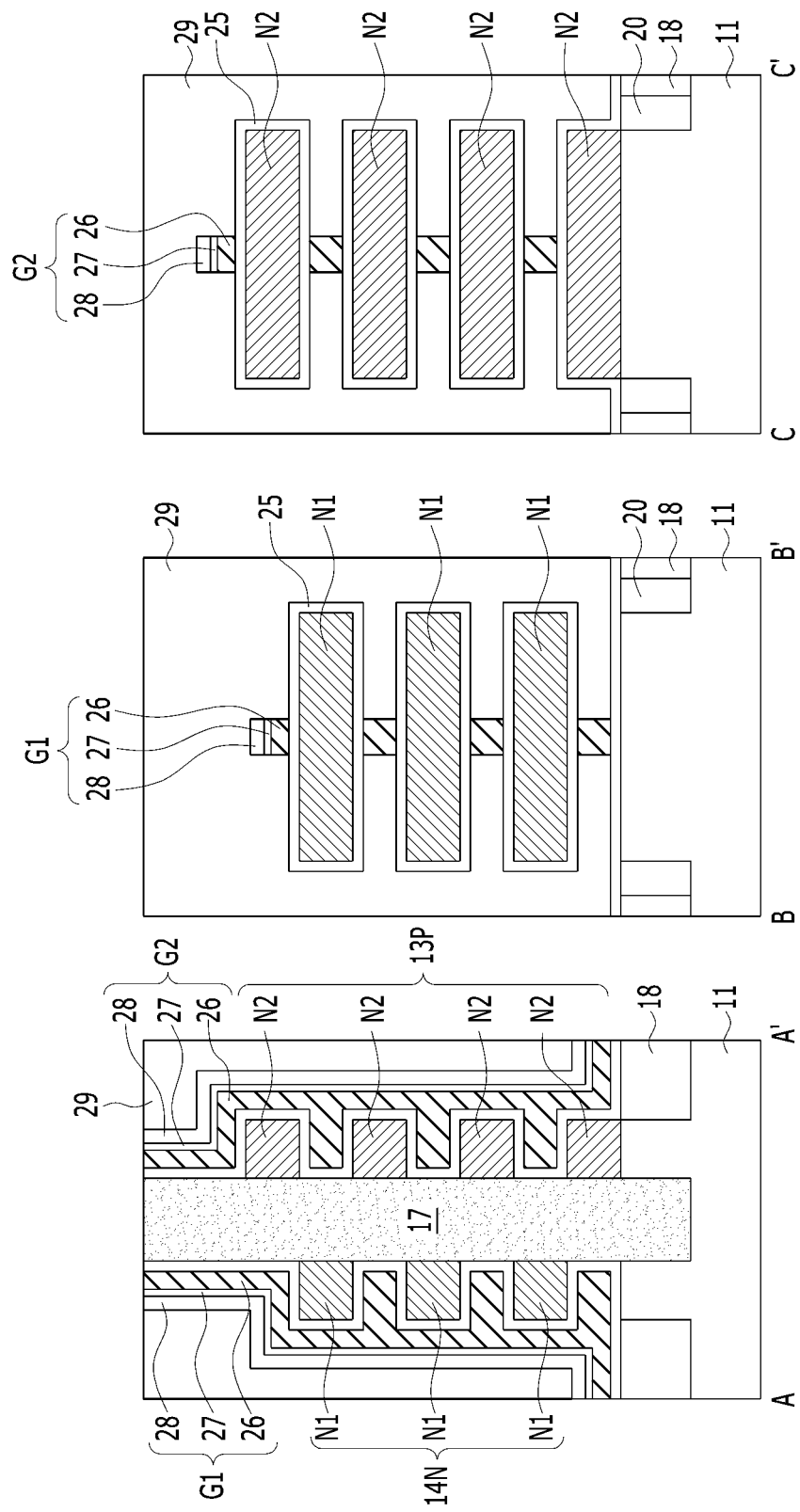

As shown in FIG. 17, a capping layer 29 may be formed on the first gate G1 and the second gate G2. The capping layer 29 may include, for example, silicon nitride. The capping layer 29 may cover sidewalls of the third gate layers 28. The capping layer 29 may be deposited to have a thickness of 500 to 1000 Å using the ALD or CVD methods. For example, in order to form the capping layer 29, a planarization process and an etch-back process may be sequentially performed after depositing silicon nitride. The first gate G1 and the second gate G2 may be spaced apart from each other by a planarization process and an etch-back process for forming the capping layer 29.

Figure 18:
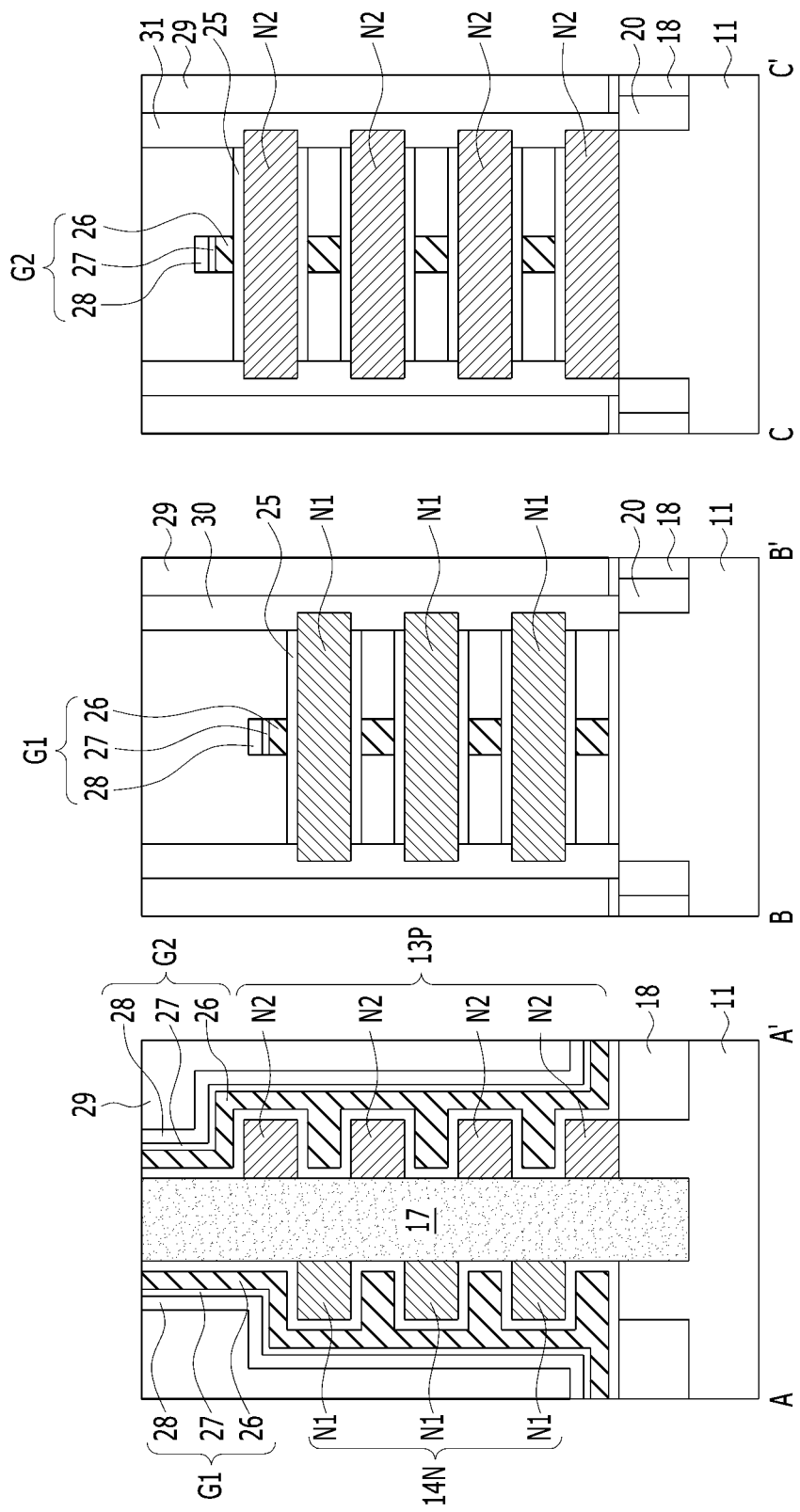

As shown in FIG. 18, a plurality of first and second common source/drain layers 30 and 31 passing through the capping layer 29 may be formed. Referring to the B-B' direction, the first common source/drain layers 30 may be commonly connected to both end portions of the first nano sheets N1. Referring to the C-C' direction, the second common source/drain layers 31 may be commonly connected to both end portions of the second nano sheets N2. The first and second common source/drain layers 30 and 31 may be connected to the first and second buried source/drain layers 20, respectively. To form the first and second common source/drain layers 30 and 31, portions of the gate dielectric layer 25 may be etched to expose the end portions of the first and nano sheets N1 and N2.

The first nano sheets N1, the gate dielectric layer 25, and the first gate G1 may constitute an N-channel transistor. The threshold voltage of an N-channel transistor may be controlled by the dipole inducing layer 25C of the gate dielectric layer 25. The second nano sheets N2, the gate dielectric layer 25, and the second gate G2 may constitute a P-channel transistor, and the threshold voltage of the P-channel transistor may be controlled by the second nano sheets N2.

In an embodiment, the first and second nano sheets N1 and N2 are vertically stacked, and the first and second gates G1 and G2 are formed around the first and second nano sheets N1 and N2. Thus, gate control is improved, and a short channel effect can be suppressed.

In the present embodiment, a driving current may be increased compared to that of a two-dimensional transistor because the first and second nano sheets N1 and N2 having a three-dimensional structure are vertically stacked.

Figure 19:
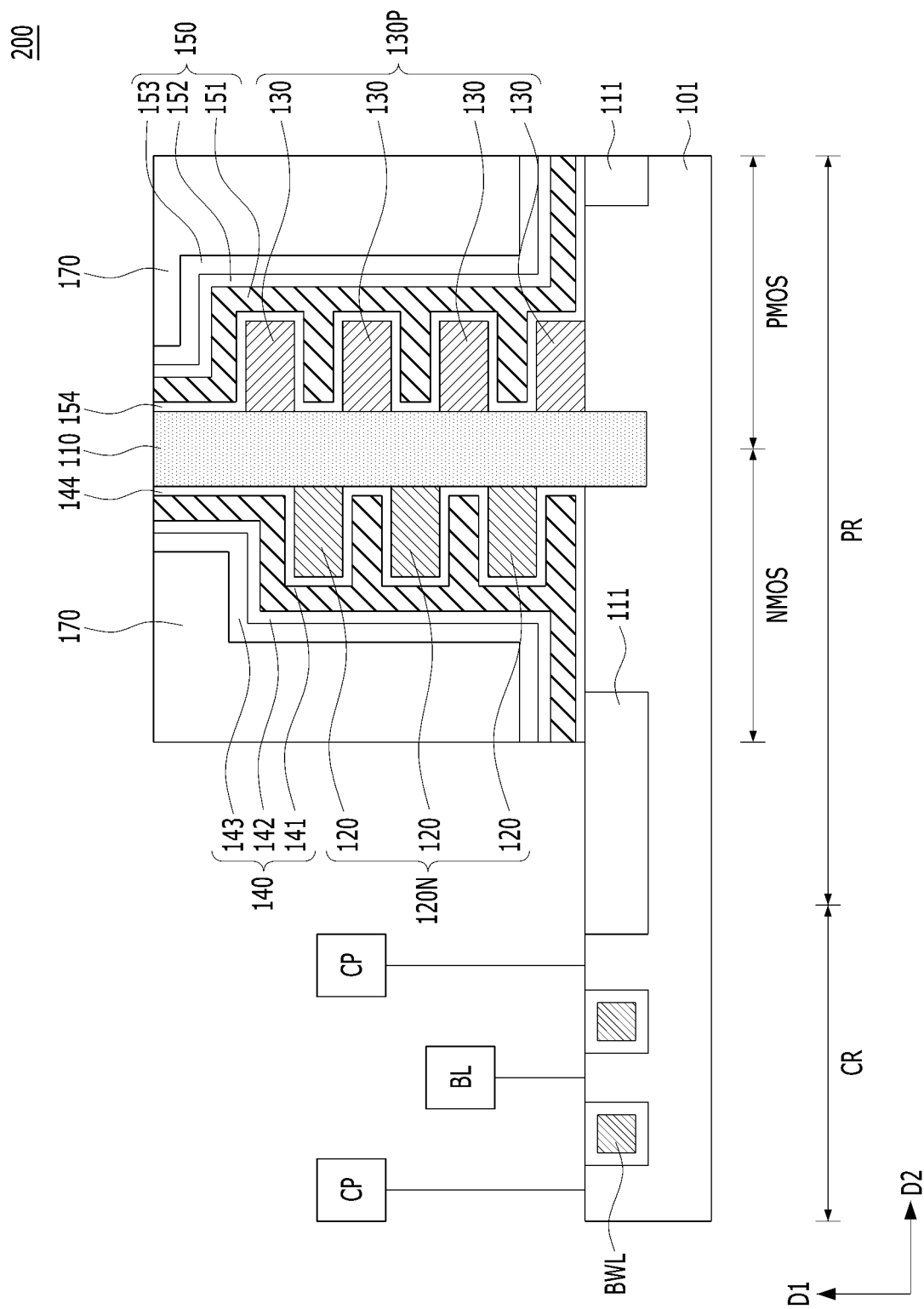
FIG. 19 is a diagram illustrating a semiconductor device according to an embodiment of the present invention.

FIG. 19 is a diagram illustrating a semiconductor device according to another embodiment of the present invention. The semiconductor device 200 of FIG. 19 may be similar to the semiconductor device 100 of FIGS. 1A and 1B. Hereinafter, detailed descriptions of duplicate components may be omitted.

Referring to FIGS. 1A, 1B, and 19, the semiconductor device 200 may include a cell region CR including memory cells and a peripheral circuit region PR including a plurality of peripheral circuit transistors for controlling the memory cells. The cell region CR may include a buried word line BWL, a bit line BL, and a capacitor CP. The peripheral circuit region PR may include a plurality of nano sheet transistor arrays NMOS and PMOS, and the nano sheet transistor arrays NMOS and PMOS may include an N-channel nano sheet transistor array NMOS including a first nano sheet stack 120N and a P-channel nano sheet transistor array PMOS including a second nano sheet stack 130P.

The N-channel nano sheet transistor array NMOS may include a first nano sheet stack 120N, a first gate dielectric layer 144, and a first gate 140. The first nano sheet stack 120N may include a plurality of first nano sheets 120 stacked in a direction vertical to the substrate 101. The first gate 140 may include a first around-gate layer 141, a first liner gate layer 142, and a first low resistivity gate layer 143. The first gate dielectric layer 144 may include a dipole inducing layer. As referenced in FIGS. 1A and 1B, first common source/drain layers 160S may be connected to both end portions of the first nano sheets 120, and the first common source/drain layers 160S may be connected to the first buried source/drain layers 160 buried in the substrate 101.

The P-channel nano sheet transistor array PMOS may include a second nano sheet stack 130P, a second gate dielectric layer 154, and a second gate 150. The second nano sheet stack 130P may include a plurality of second nano sheets 130 stacked in a direction vertical to the substrate 101. The second gate 150 may include a second around-gate layer 151, a second liner gate layer 152, and a second low resistivity gate layer 153. The second gate dielectric layer 154 is dipole-free and not including a dipole inducing layer. As referenced in FIGS. 1A and 1B, second common source/drain layers 161S may be respectively connected to both end portions of the second nano sheets 130, and the second common source/drain layers 161S may be connected to the second buried source/drain layers 161 buried in the substrate 101.

An isolation wall 110 may be formed between the N-channel nano sheet transistor array NMOS and the P-channel nano sheet transistor array PMOS. An isolation wall 110 may be formed between the first nano sheet stack 120N and the second nano sheet stack 130P. The first nano sheets 120 and the second nano sheets 130 may be spaced apart from each other with the isolation wall 110 interposed therebetween. The first nano sheets 120 and the second nano sheets 130 may be disposed at different horizontal levels.

A separation layer 111 may be formed in the substrate 101, and the cell region CR and the peripheral circuit region PR may be spaced apart from each other by the separation layer 111.

The buried word line BWL may be spaced apart from the first gate 140 and the second gate 150 and buried in the substrate 101.

The first nano sheets 120 may include silicon nano sheets, and the second nano sheets 130 may include silicon germanium nano sheets.

In another embodiment, a dielectric layer may be further formed between the lowermost second nano sheet 130 of the second nano sheet stack 130P and the substrate 101 in the above-described embodiments. Accordingly, the lowermost second nano sheet 130 may be spaced apart from the substrate 101.

In another embodiment, in the above-described embodiments, at least one of the first nano sheets 120 and the second nano sheets 130 may include an oxide semiconductor material such as indium gallium zinc oxide (IGZO). For example, both the first nano sheets 120 and the second nano sheets 130 may be formed of an oxide semiconductor material. The first nano sheets 120 may be silicon nano sheets, and the second nano sheets 130 may be oxide semiconductor nano sheets. The first nano sheets 120 may be oxide semiconductor nano sheets, and the second nano sheets 130 may be silicon germanium nano sheets.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A method for fabricating a semiconductor device, the method comprising:
   forming an alternating stack in which first semiconductor materials and second semiconductor materials are alternately disposed on a substrate;
   forming a first sheet stack and a second sheet stack by etching the alternating stack;
   forming an isolation wall between the first and second sheet stacks;
   forming buried source/drain layers in the substrate to be aligned with the first and second sheet stacks;
   removing the second semiconductor materials from the first sheet stack to form a first nano sheet stack of the first semiconductor materials;
   removing the first semiconductor materials from the second sheet stack to form a second nano sheet stack of the second semiconductor materials;

forming a first gate and a second gate on the first nano sheet stack and the second nano sheet stack, respectively; and forming first common source/drain layers and second common source/drain layers over the buried source/drain layers to be connected to the first nano sheet stack and the second nano sheet stack, respectively.

2. The method of claim 1, wherein the first semiconductor materials of the first nano sheet stack and the second semiconductor materials of the second nano sheet stack are horizontally oriented and parallel to a surface of the substrate and are disposed in different horizontal levels.

3. The method of claim 1, wherein the first semiconductor materials include a silicon layer and the second semiconductor materials include a silicon germanium layer.

4. The method of claim 1, wherein the buried source/drain layers include metal silicide.

5. The method of claim 1, wherein the first common source/drain layers and the second common source/drain layers include polysilicon.

6. The method of claim 1, further comprising forming a first gate dielectric layer disposed between the first semiconductor materials and the first gate and including a dipole inducing layer.

7. The method of claim 6, wherein the dipole inducing layer includes lanthanum oxide or magnesium oxide.

8. The method of claim 1, further comprising forming a second gate dielectric layer disposed between the second semiconductor materials and the second gate, wherein the second gate dielectric layer is dipole-free.

9. The method of claim 1, wherein the first gate covers portions of the first semiconductor materials of the first nano sheet stack and extends in a direction vertical to the substrate, and wherein the second gate covers portions of the second semiconductor materials of the second nano sheet stack and extends in a direction vertical to the substrate.

10. The method of claim 1, wherein the first common source/drain layers commonly connect to the end portions of the first semiconductor materials of the first nano sheet stack and extend in a direction vertical to the substrate, and wherein the second common source/drain layers commonly connect to the end portions of the second semiconductor materials of the second nano sheet stack and extend in a direction vertical to the substrate.

11. The method of claim 1, wherein the first semiconductor materials and the second semiconductor materials are formed to a same height.

12. The method of claim 1, wherein one of the first semiconductor materials and the second semiconductor materials have a lower height than the other of the first semiconductor materials and the second semiconductor materials.

13. The method of claim 12, wherein the first semiconductor materials are formed to a first height and the second semiconductor materials are formed to a second height lower than the first height.

14. The method of claim 12, wherein the first semiconductor materials are formed to a same height, while the second semiconductor materials are formed to different heights.

15. The method of claim 14, wherein the second semiconductor material at the lowest level has a height greater than the second semiconductor material at the highest level.

* * * * *